US012727264B2

(12) United States Patent
Hoshi

(10) Patent No.: US 12,727,264 B2
(45) Date of Patent: Sep. 1, 2026

(54) SOLID-STATE IMAGING ELEMENT AND IMAGING DEVICE WITH FIRST PIXEL FOR GRADATION SIGNAL AND SECOND PIXEL FOR EVENT DETECTION HAVING LARGER PHOTOELECTRIC CONVERSION PORTION VOLUME

(71) Applicant: SONY SEMICONDUCTOR SOLUTIONS CORPORATION, Kanagawa (JP)

(72) Inventor: Hironori Hoshi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 373 days.

(21) Appl. No.: 18/260,339

(22) PCT Filed: Dec. 13, 2021

(86) PCT No.: PCT/JP2021/045809
§ 371 (c)(1),
(2) Date: Jul. 5, 2023

(87) PCT Pub. No.: WO2022/153758
PCT Pub. Date: Jul. 21, 2022

(65) Prior Publication Data

US 2024/0055447 A1 Feb. 15, 2024

(30) Foreign Application Priority Data

Jan. 13, 2021 (JP) ................................ 2021-003402

(51) Int. Cl.
*H10F 39/00* (2025.01)
*H04N 25/702* (2023.01)
(Continued)

(52) U.S. Cl.
CPC ....... *H10F 39/8027* (2025.01); *H04N 25/702* (2023.01); *H04N 25/707* (2023.01);
(Continued)

(58) Field of Classification Search
None
See application file for complete search history.

(56) References Cited

U.S. PATENT DOCUMENTS

2010/0033611 A1* 2/2010 Lee ..................... H04N 25/705 348/302
2018/0359434 A1* 12/2018 Tanaka ................. H10F 39/182
(Continued)

FOREIGN PATENT DOCUMENTS

WO 2015/170628 A1 11/2015
WO 2017/098830 A1 6/2017
(Continued)

OTHER PUBLICATIONS

Imaging Device for Electronic Device, Has Holding Unit That Holds Electric Charge Transferred From Photoelectric Conversion Unit Such That Pressure Rise Line Rises Floating Diffusions Which Are Shared By Pixels, Kumagai et al., 2020. (Year: 2020).*
International Search Report and Written Opinion of PCT Application No. PCT/JP2021/045809, issued on Mar. 1, 2022, 10 pages of ISRWO.

*Primary Examiner* — Nilufa Rahim
(74) *Attorney, Agent, or Firm* — CHIP LAW GROUP

(57) ABSTRACT

A solid-state imaging element according to the present technology includes a pixel array unit in which a plurality of pixels each having a photoelectric conversion portion is arranged, the pixel array unit includes, as the pixels, a first pixel for obtaining a gradation signal indicating an intensity of received light and a second pixel for detecting that a change in an amount of received light exceeds a predetermined threshold value, and a volume of a photoelectric conversion portion included in the second pixel is larger than
(Continued)

a volume of a photoelectric conversion portion included in the first pixel.

19 Claims, 14 Drawing Sheets

(51) Int. Cl.
*H04N 25/707* (2023.01)
*H04N 25/771* (2023.01)

(52) U.S. Cl.
CPC ......... *H04N 25/771* (2023.01); *H10F 39/806* (2025.01); *H10F 39/8063* (2025.01); *H10F 39/807* (2025.01)

(56) References Cited

U.S. PATENT DOCUMENTS

| | | | | |
|---|---|---|---|---|
| 2021/0266476 | A1* | 8/2021 | Kumagai | H10F 39/813 |
| 2021/0306580 | A1* | 9/2021 | Lee | H10F 39/807 |

FOREIGN PATENT DOCUMENTS

| | | | |
|---|---|---|---|
| WO | 2019/175733 | A1 | 9/2019 |
| WO | 2020/022054 | A1 | 1/2020 |
| WO | 2020/105301 | A1 | 5/2020 |
| WO | 2020/110537 | A1 | 6/2020 |

* cited by examiner

FIG. 4

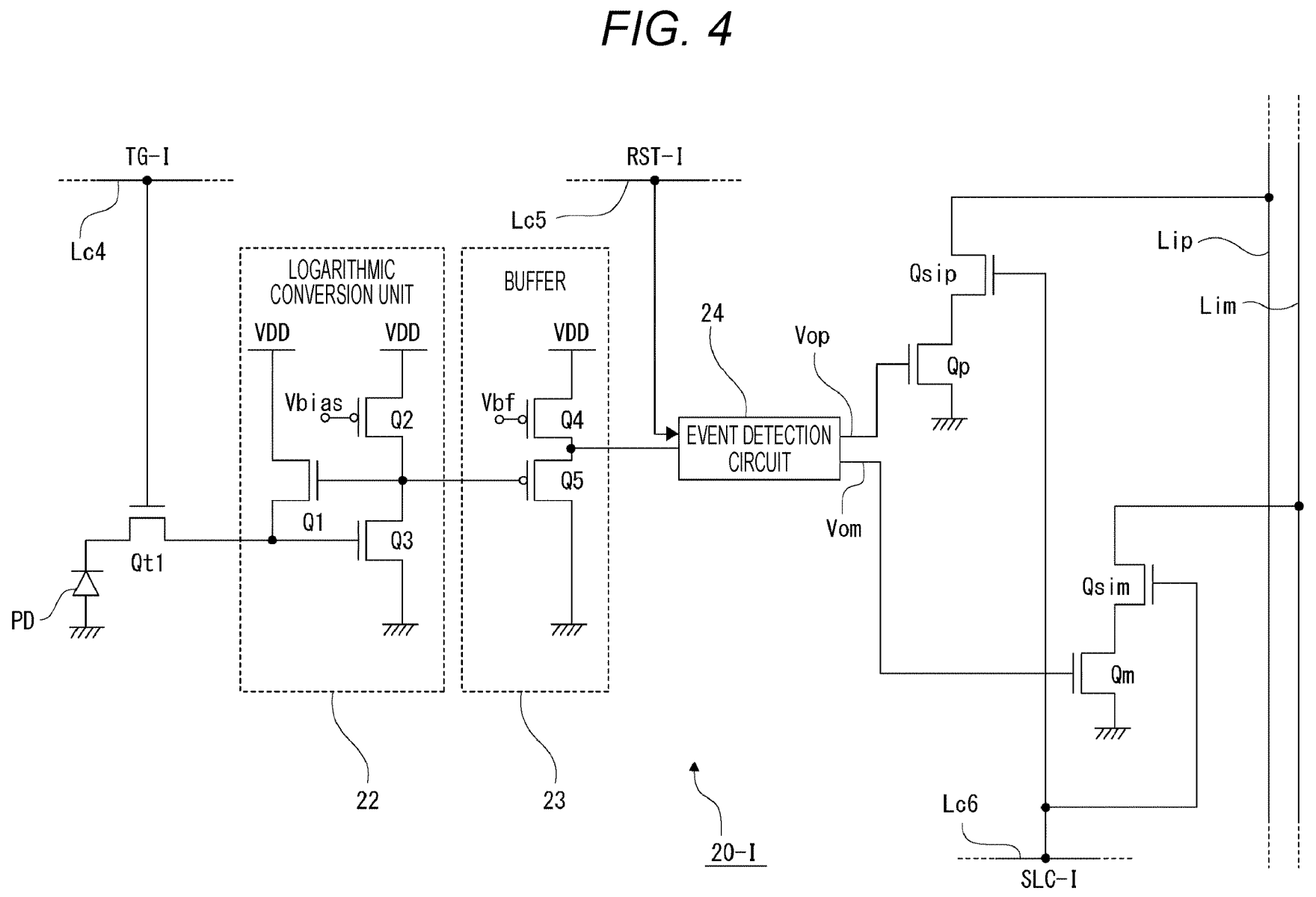

Lip
Lim
Qsim
Qm
SLC-I
Lc6
Qsip
Qp
Vop
Vom
EVENT DETECTION CIRCUIT
24
20-I
RST-I
Lc5
BUFFER
VDD
Q4
Q5
Vbf
23
LOGARITHMIC CONVERSION UNIT
VDD
Q2
Q3
Vbias
Q1
VDD
22
TG-I
Lc4
Qt1
PD Vop
Vom
QUANTIZER
SUBTRACTOR
BUFFER
LOGARITHMIC CONVERSION UNIT
VDD
Q1
Q2
Q3
Q4
Q5
Q7
Q8
Q9
Q10
Q11
Q12
Vbias
Vbf
Vbdif
Vhigh
Vlow
C1
C2
SWr
RST-I
TG-I
Qt1
PD
22
23
24
25
26

Figure 14:
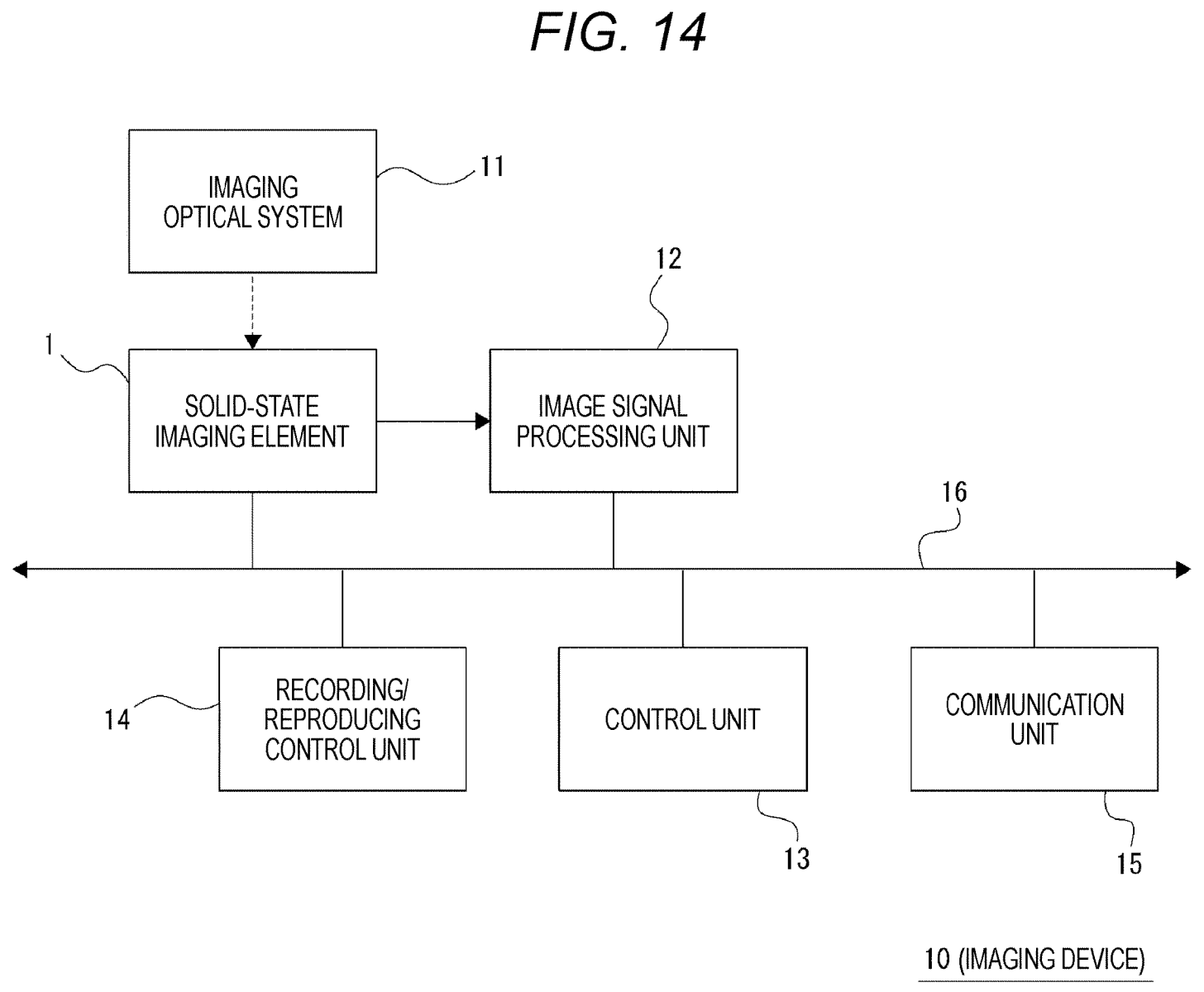

IMAGING OPTICAL SYSTEM

11

SOLID-STATE IMAGING ELEMENT

1

IMAGE SIGNAL PROCESSING UNIT

12

16

RECORDING/ REPRODUCING CONTROL UNIT

14

CONTROL UNIT

13

COMMUNICATION UNIT

15

10 (IMAGING DEVICE)

SOLID-STATE IMAGING ELEMENT AND IMAGING DEVICE WITH FIRST PIXEL FOR GRADATION SIGNAL AND SECOND PIXEL FOR EVENT DETECTION HAVING LARGER PHOTOELECTRIC CONVERSION PORTION VOLUME

CROSS REFERENCE TO RELATED APPLICATIONS

This application is a U.S. National Phase of International Patent Application No. PCT/JP2021/045809 filed on Dec. 13, 2021, which claims priority benefit of Japanese Patent Application No. JP 2021-003402 filed in the Japan Patent Office on Jan. 13, 2021. Each of the above-referenced applications is hereby incorporated herein by reference in its entirety.

TECHNICAL FIELD

The present technology relates to a solid-state imaging element and an imaging device, and particularly relates to a technical field of a solid-state imaging element in which pixels for obtaining a gradation signal indicating the intensity of received light and pixels for detecting an event that is a change in the amount of received light are mixedly mounted and an imaging device including such a solid-state imaging element.

BACKGROUND ART

As a solid-state imaging element, there is a type in which a pixel for obtaining a gradation signal and a pixel for detecting an event are mixedly mounted as pixels having a photoelectric conversion portion (see, for example, Patent Document 1 below). Here, the gradation signal is a signal indicating the intensity of received light, and the event means an event as a change exceeding a predetermined threshold value of the amount of received light.

CITATION LIST

Patent Document

Patent Document 1: WO 2020/105301 A

SUMMARY OF THE INVENTION

Problems to be Solved by the Invention

Here, with respect to pixels for event detection, it is generally required to enhance the rapidity of event detection, and in a solid-state imaging element in which pixels for gradation signals and pixels for event detection are mixedly mounted as described above, the exposure time of the pixels for event detection is made much shorter than that of the pixels for gradation signals.

For this reason, there is a problem in terms of detection accuracy of an event, for example, it being difficult to appropriately detect a weak change in the amount of light as an event.

The present technology has been made in view of the above circumstances, and an object of the present technology is to improve the light receiving sensitivity of pixels for event detection in a solid-state imaging element on which pixels for gradation signals and pixels for event detection are mixedly mounted.

Solutions to Problems

A first solid-state imaging element according to the present technology includes a pixel array unit in which a plurality of pixels each having a photoelectric conversion portion is arranged, in which the pixel array unit includes, as the pixels, a first pixel for obtaining a gradation signal indicating an intensity of received light and a second pixel for detecting that a change in an amount of received light exceeds a predetermined threshold value, and a volume of a photoelectric conversion portion included in the second pixel is larger than a volume of a photoelectric conversion portion included in the first pixel.

As described above, since the second pixel for detecting an event in which the change in the amount of received light exceeds the predetermined threshold value has a larger volume of the photoelectric conversion portion than the first pixel for detecting gradation, the second pixel can receive incident light in a wider range.

In the first solid-state imaging element according to the present technology described above, the first pixel may include a charge accumulation portion different from a floating diffusion region in a semiconductor substrate.

Accordingly, in the first pixel, accumulated charge in the photoelectric conversion portion can be held in the charge accumulation portion other than a floating diffusion region.

In the first solid-state imaging element according to the present technology described above, in an intra-pixel region of the second pixel, both a first intra-pixel region that is the same intra-pixel region as a region where the photoelectric conversion portion is formed in the first pixel and a second intra-pixel region that is the same intra-pixel region as a region where the charge accumulation portion is formed in the first pixel may be formed as the photoelectric conversion portion.

As described above, by forming the region where the charge accumulation portion is formed in the first pixel as the photoelectric conversion portion in the intra-pixel region of the second pixel, the volume of the photoelectric conversion portion of the second pixel becomes larger than that of the first pixel. Furthermore, by employing a configuration in which the intra-pixel region that is used as the charge accumulation portion in the first pixel is used as the photoelectric conversion portion in this manner, the frame structure that separates the photoelectric conversion portion and the charge accumulation portion from each other in the first pixel can also be applied to the second pixel side.

In the first solid-state imaging element according to the present technology described above, a first trench that is a trench separating a formation region of the photoelectric conversion portion and a formation region of the charge accumulation portion from each other may be formed in the first pixel, a second trench that is a trench separating the first intra-pixel region and the second intra-pixel region from each other may be formed in the second pixel, and a depth of the second trench may be shallower than a depth of the first trench.

By making the depth of the second trench, that is, the trench separating the photoelectric conversion portion formed in the second pixel shallow, light easily enters the photoelectric conversion portion on the second intra-pixel region side from the photoelectric conversion portion on the first intra-pixel region side.

In the first solid-state imaging element according to the present technology described above, an intra-region trench that is a trench separating a part of the second intra-pixel region may be formed in the second pixel.

By forming the intra-region trench, it is possible to increase the number of light reflecting surfaces in the second intra-pixel region. At the same time, it becomes easy to confine light in the inner part of the photoelectric conversion portion in the second intra-pixel region (it becomes difficult for light to return from the second intra-pixel region to the first intra-pixel region side).

In the first solid-state imaging element according to the present technology described above, the intra-region trench may have four or more surfaces.

Accordingly, it is possible to further increase the number of light reflecting surfaces in the second intra-pixel region.

In the first solid-state imaging element according to the present technology described above, at least a part of a cross-sectional shape of the intra-region trench may have a cross shape or a T shape.

By forming at least a part of the cross-sectional shape into a cross shape or a T shape as described above, an intra-region trench having four or more surfaces is realized. At this time, forming at least a part of the cross-sectional shape of the trench into a cross shape or a T shape can be easily realized by patterning the trench at the time of forming the trench.

In the first solid-state imaging element according to the present technology described above, a plurality of the intra-region trenches may be formed.

Accordingly, it is possible to further increase the number of light reflecting surfaces in the second intra-pixel region, and it becomes easier to confine light in the inner part of the second intra-pixel region.

In the first solid-state imaging element according to the present technology described above, in the second pixel, a light incident surface of the semiconductor substrate may have a moth-eye structure.

With the moth-eye structure described above, light via the microlens can be scattered and made incident on the photoelectric conversion portion of the second pixel.

In the first solid-state imaging element according to the present technology described above, a size of the second pixel may be equivalent to a size of a plurality of pixels of the first pixel.

Accordingly, the photoelectric conversion portion of the second pixel can be made larger as compared with a case where the sizes of the first and second pixels are the same.

In the first solid-state imaging element according to the present technology described above, in the second pixel, a waveguide that guides light toward a photoelectric conversion portion may be formed between a microlens and the photoelectric conversion portion.

Accordingly, in the second pixel having the size equivalent to the size of the plurality of pixels of the first pixel, the light incident on the region corresponding to the plurality of pixels can be efficiently guided to the photoelectric conversion portion.

An imaging device according to the present technology includes: a solid-state imaging element including a pixel array unit in which a plurality of pixels each having a photoelectric conversion portion is arranged, the pixel array unit including, as the pixels, a first pixel for obtaining a gradation signal indicating an intensity of received light and a second pixel for detecting that a change in an amount of received light exceeds a predetermined threshold value, and a volume of a photoelectric conversion portion included in the second pixel being larger than a volume of a photoelectric conversion portion included in the first pixel; and a signal processing unit that receives and processes a captured image based on the gradation signal obtained by the first pixel.

Also with such an imaging device, it is possible to obtain effects similar to those of the first solid-state imaging element according to the present technology described above.

A second solid-state imaging element according to the present technology includes: a semiconductor substrate; a first pixel including a first photoelectric conversion portion in the semiconductor substrate in a cross-sectional view, a first charge accumulation portion, and a first trench between the first photoelectric conversion portion and the first charge accumulation portion; a second pixel including a second photoelectric conversion portion that is adjacent to the first pixel in the cross-sectional view and is in the semiconductor substrate, a third photoelectric conversion portion, and a second trench between the second photoelectric conversion portion and the third photoelectric conversion portion; and a third trench between the first charge accumulation portion and the second photoelectric conversion portion in the cross-sectional view.

With the above configuration, the second pixel for detecting an event in which the change in the amount of received light exceeds the predetermined threshold value has a larger volume of the photoelectric conversion portion than the first pixel for detecting gradation, and thus the second pixel can receive incident light in a wider range.

In the second solid-state imaging element according to the present technology described above, the third trench may be provided to penetrate the semiconductor substrate.

This makes it possible to enhance the separation performance between the first and second pixels.

In the second solid-state imaging element according to the present technology described above, the second pixel may be a pixel for detecting that a change in an amount of received light exceeds a predetermined threshold value.

That is, the second pixel is a pixel for detecting an event in which the change in the amount of received light exceeds a predetermined threshold value.

In the second solid-state imaging element according to the present technology described above, the first charge accumulation portion may be different from a floating diffusion region included in the first pixel.

Accordingly, in the first pixel, accumulated charge in the photoelectric conversion portion can be held in the charge accumulation portion other than a floating diffusion region.

The second solid-state imaging element according to the present technology described above may further include a fourth trench provided in the third photoelectric conversion portion.

By forming the fourth trench, it is possible to increase the number of light reflecting surfaces in the third photoelectric conversion portion. At the same time, it becomes easy to confine light in the inner part of the third photoelectric conversion portion (it becomes difficult for light to return from the third photoelectric conversion portion to the second photoelectric conversion portion side).

In the second solid-state imaging element according to the present technology described above, the fourth trench may be formed from a surface of the semiconductor substrate opposite to a light incident surface.

That is, the fourth trench is formed as a front trench isolation (FTI).

In the second solid-state imaging element according to the present technology described above, the second pixel may further include a fourth photoelectric conversion portion, and a fifth trench may be provided between the third photoelectric conversion portion and the fourth photoelectric conversion portion.

By forming the fifth trench, it is possible to increase the number of light reflecting surfaces in a photoelectric conversion region including the third photoelectric conversion portion and the fourth photoelectric conversion portion. At the same time, it becomes easy to confine light in the inner part of the photoelectric conversion region (it becomes difficult for light to return from the fourth photoelectric conversion portion to the third photoelectric conversion portion side).

In the second solid-state imaging element according to the present technology described above, a moth-eye structure may be provided on the second photoelectric conversion portion and on a light incident surface of the semiconductor substrate.

With the moth-eye structure described above, light via the microlens can be scattered and made incident on the photoelectric conversion portion of the second pixel.

BRIEF DESCRIPTION OF DRAWINGS

FIG. 4 is an equivalent circuit diagram of a second pixel in the embodiment.

FIG. 6 is a diagram illustrating a schematic longitudinal cross-sectional structure of a pixel array unit in the first embodiment.

FIG. 8 is a diagram illustrating a schematic longitudinal cross-sectional structure of a pixel array unit as a second embodiment.

MODE FOR CARRYING OUT THE INVENTION

Hereinafter, embodiments will be described in the following order.

1. First Embodiment
[1-1. Overall Configuration of Solid-State Imaging Element]
[1-2. Configuration of Pixel]
[1-3. Pixel Structure as First Embodiment]
2. Second Embodiment
3. Third Embodiment
4. Fourth Embodiment
<5. Imaging Device>
<6. Simulation Results>
<7. Modification>
<8. Summary of Embodiments>
<9. Present Technology>

1. First Embodiment

[1-1. Overall Configuration of Solid-State Imaging Element]

Figure 1:
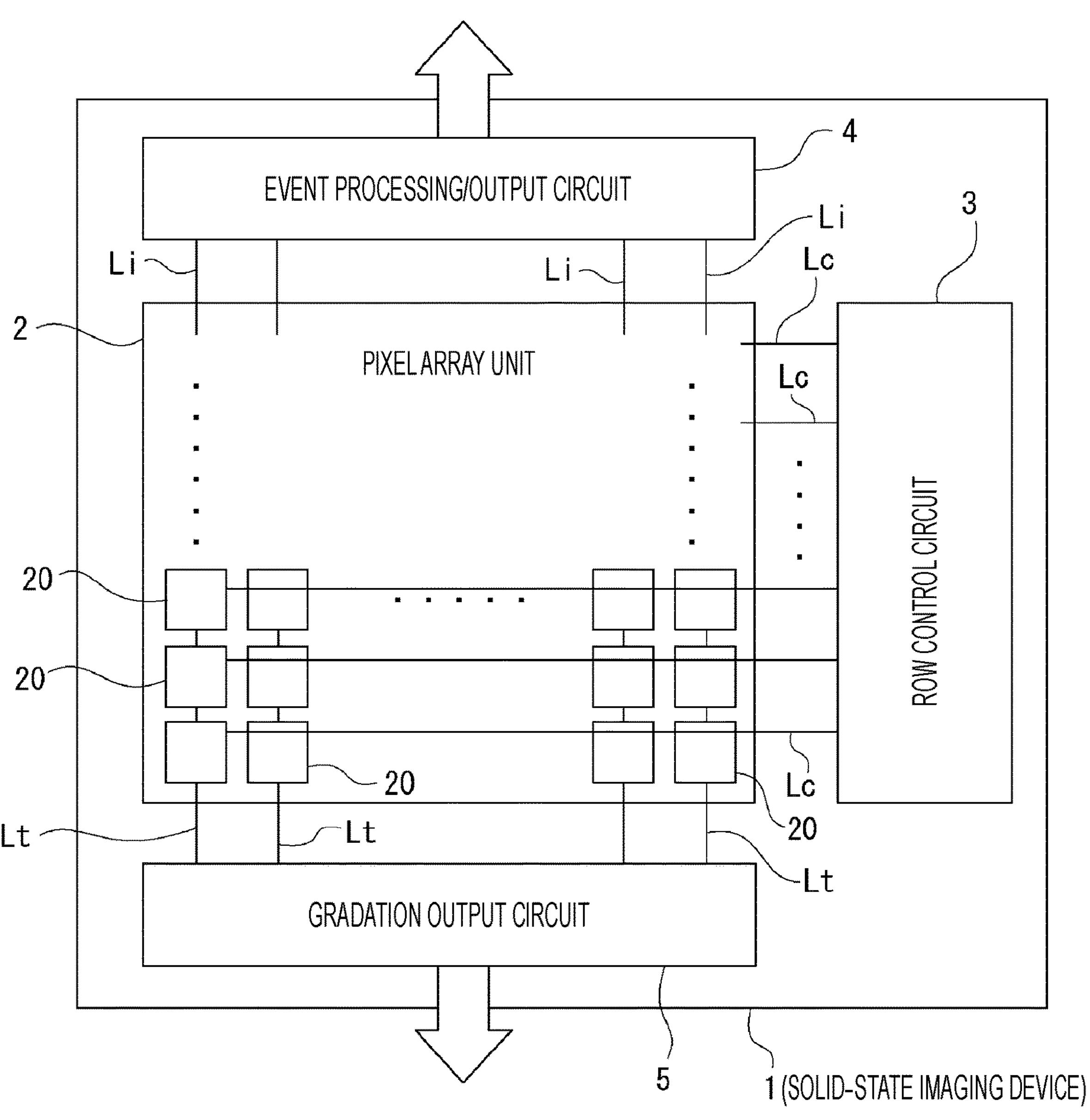
FIG. 1 is a block diagram illustrating an internal configuration example of a solid-state imaging element as a first embodiment according to the present technology.

FIG. 1 is a block diagram illustrating an internal configuration example of a solid-state imaging element 1 as a first embodiment according to the present technology.

As illustrated, the solid-state imaging element 1 includes a pixel array unit 2, a row control circuit 3, an event processing/output circuit 4, and a gradation output circuit 5.

The pixel array unit 2 has a configuration in which a plurality of pixels 20 is two-dimensionally arranged in a matrix in a row direction and a column direction. Here, the row direction refers to a pixel arrangement direction in a horizontal direction, and the column direction refers to a pixel arrangement direction in a vertical direction. In the drawing, the row direction is a lateral direction, and the column direction is a longitudinal direction.

Each pixel 20 includes a photodiode (PD) to be described later as a photoelectric conversion portion that performs photoelectric conversion.

Here, in the solid-state imaging element 1 of this example, the pixel array unit 2 includes, as the pixel 20, a first pixel (hereinafter referred to as a "gradation pixel 20-T") for obtaining a gradation signal indicating the intensity of received light, and a second pixel (hereinafter referred to as an "event pixel 20-I") for detecting an event that a change in the amount of received light exceeds a predetermined threshold value. In this example, the gradation pixel 20-T is configured to have sensitivity to visible light, and the event pixel 20-I is configured to have sensitivity to light in a band other than visible light, such as infrared (IR) light, for example.

An arrangement example of the gradation pixel 20-T and the event pixel 20-I in the pixel array unit 2 will be described with reference to FIG. 2.

As a premise, in this example, pixels corresponding to red (R), green (G), and blue (B) are provided as the gradation pixels 20-T in order to cope with capturing of a color image. Specifically, these gradation pixels 20-T of R, G, and B are arranged in a Bayer array. Then, the event pixels 20-I are arranged at predetermined intervals between the gradation pixels 20-T arranged in the Bayer array in this manner. In this example, the event pixels 20-I are arranged at a ratio of one for four gradation pixels 20-T constituting one unit of RGGB.

As illustrated in FIG. 1, in the pixel array unit 2, a control line Lc is wired along the row direction for each pixel row, and an event vertical signal line Li and a gradation vertical signal line Lt are wired along the column direction for each pixel column in a matrix pixel array.

The control line Lc transmits various signals for driving when signals are read from the gradation pixel 20-T and the event pixel 20-I. Note that, although each control line Lc is illustrated as one wiring in FIG. 1 for convenience of illustration, each control line Lc is configured by a plurality of control lines Lc as will be described later. One end of each control line Lc is connected to an output end corresponding to each row of the row control circuit 3.

The row control circuit 3 includes, for example, a timing generator that generates various timing signals, a shift register, an address decoder, and the like, drives the gradation pixel 20-T and the event pixel 20-I in the pixel array unit 2 by outputting various signals through the control line Lc, and controls generation and reading of a gradation signal and generation and reading of an event signal.

In the present embodiment, for the gradation pixel 20-T, gradation signal generation is performed by a global shutter system.

Note that a specific pixel driving method in the present embodiment will be described later again.

The event vertical signal line Li is used as a wiring for transmitting an event signal read from the event pixel 20-I to the event processing/output circuit 4, and one end of each event vertical signal line Li is connected to an output end corresponding to each column of the event processing/output circuit 4.

The event processing/output circuit 4 acquires an event signal read from the event pixel 20-I through the event vertical signal line Li, performs predetermined signal processing on the event signal, and outputs the event signal.

The gradation vertical signal line Lt is used as a wiring for transmitting a gradation signal read from the gradation pixel 20-T to the gradation output circuit 5, and one end of each gradation vertical signal line Lt is connected to an output end corresponding to each column of the gradation output circuit 5.

The gradation output circuit 5 receives a gradation signal read from the gradation pixel 20-T through the gradation vertical signal line Lt, performs predetermined signal processing, such as, for example, analog to digital (A/D) conversion processing, on the gradation signal, and outputs the signal.

[1-2. Configuration of Pixel]

Next, the configurations of the gradation pixel 20-T and the event pixel 20-I will be described.

Figure 3:
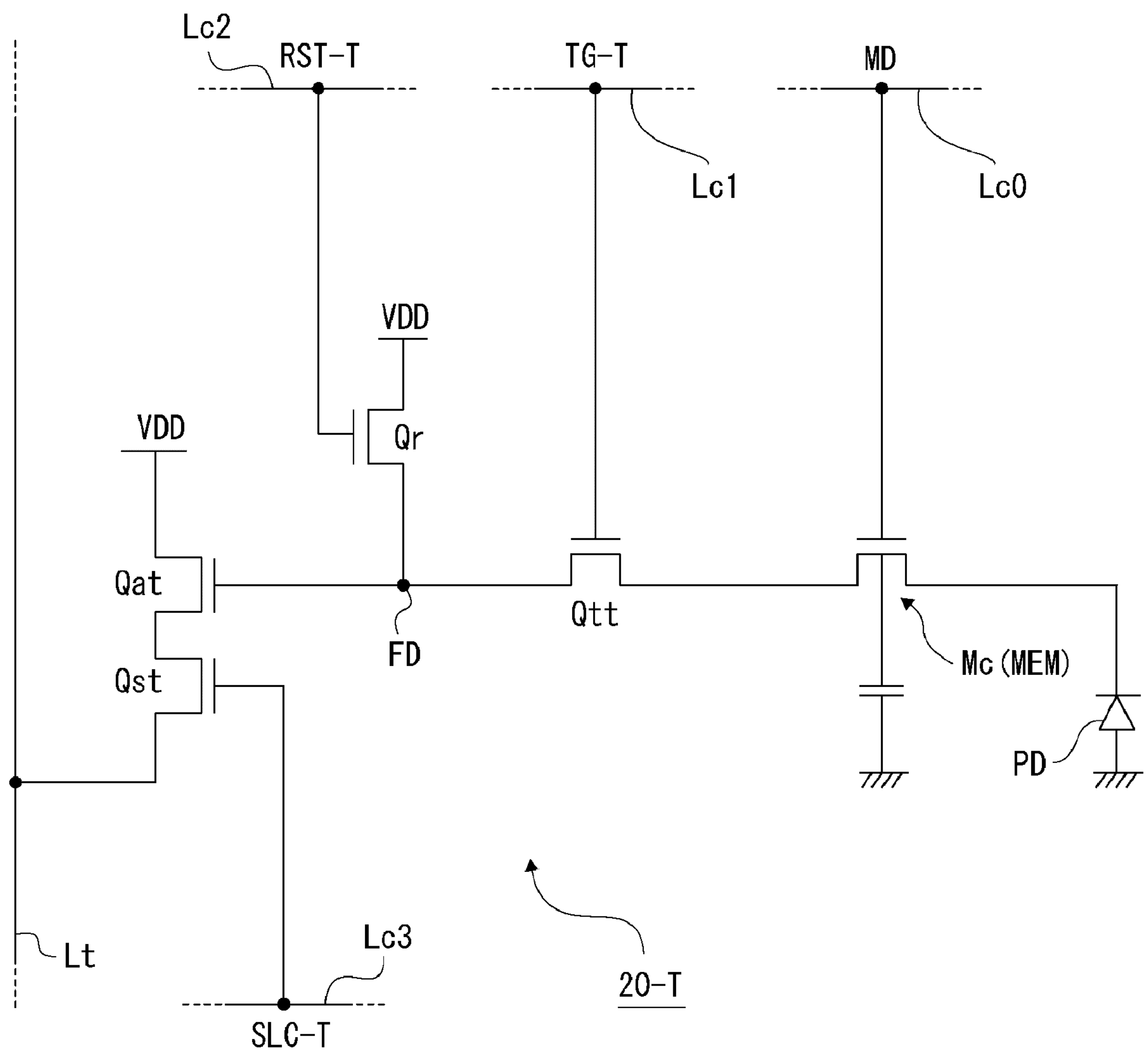
FIG. 3 is an equivalent circuit diagram of a first pixel in the embodiment.

FIG. 3 is an equivalent circuit diagram of the gradation pixel 20-T.

As illustrated, the gradation pixel 20-T includes a photodiode PD as a photoelectric conversion element, and also includes a memory element (MEM) Mc, a gradation transfer transistor Qtt, a floating diffusion (floating diffusion region) FD, a reset transistor Qr, an amplification transistor Qat, and a gradation selection transistor Qst.

Here, in this example, the various transistors included in the gradation pixel 20-T are constituted by, for example, metal-oxide-semiconductor field-effect transistors (MOSFETs).

Furthermore, as the above-described control lines Lc, a control line Lc0 for transmitting a memory drive signal MD for driving the memory element Mc, a control line Lc1 for transmitting a gradation transfer drive signal TG-T, a control line Lc2 for transmitting a charge reset signal RST-T, and a control line Lc3 for transmitting a gradation selection signal SLC-T are wired to the gradation pixel 20-T.

As illustrated, the memory element Mc is connected in parallel to the photodiode PD. The memory element Mc is provided to temporarily (after exposure period, until reading timing) hold accumulated charge of the photodiode PD in accordance with the global shutter system. In this example, the memory element Mc is configured as a MOS capacitor, and the control line Lc0 is connected to a gate electrode as illustrated in the drawing. When the memory drive signal MD supplied via the control line Lc0 is turned on, the memory element Mc enters a state capable of holding charges.

The gate of the gradation transfer transistor Qtt is connected to the control line Lc1, and when the gradation transfer drive signal TG-T supplied from the control line Lc1 is turned on, the gradation transfer transistor Qtt becomes conductive and transfers the charge temporarily held in the memory element Mc to the floating diffusion FD.

The floating diffusion FD temporarily holds the charge transferred from the memory element Mc via the gradation transfer transistor Qtt.

The gate of the reset transistor Qr is connected to the control line Lc2, and when the charge reset signal RST-T supplied from the control line Lc2 is turned on, the reset transistor Qr becomes conductive and resets a potential of the floating diffusion FD to a reference potential VDD.

The source of the amplification transistor Qat is connected to the gradation vertical signal line Lt via the gradation selection transistor Qst and the drain thereof is connected to the reference potential VDD (constant current source) to form a source follower circuit.

The gradation selection transistor Qst is connected between the source of the amplification transistor Qat and the gradation vertical signal line Lt, and the gate thereof is connected to the control line Lc3. When the gradation selection signal SLC-T supplied from the control line Lc3 to the gate of the gradation selection transistor Qst is turned on, the gradation selection transistor Qst becomes conductive and outputs the charge held in the floating diffusion FD to the gradation vertical signal line Lt via the amplification transistor Qat.

Operation of the gradation pixel 20-T related to generation and reading of a gradation signal will be briefly described.

First, before light reception is started, a charge resetting operation (electronic shutter operation) for resetting the charge of the gradation pixel 20-T is performed. That is, the reset transistor Qr and the gradation transfer transistor Qtt are turned on (conductive), and the accumulated charges of the photodiode PD, the memory element Mc, and the floating diffusion FD are reset.

After resetting the accumulated charges, the reset transistor Qr and the gradation transfer transistor Qtt are turned off to start charge accumulation in the photodiode PD. After a predetermined charge accumulation period, the memory drive signal MD is turned on, and the accumulated charge of the photodiode PD is temporarily held in the memory element Mc.

Thereafter, when the charge signal accumulated in the photodiode PD is read, the gradation transfer transistor Qtt is turned on, and the gradation selection transistor Qst is turned on. Accordingly, the charge signal temporarily held in the memory element Mc is transferred to the floating diffusion FD, and the charge signal held in the floating diffusion FD is output to the gradation vertical signal line Lt via the amplification transistor Qat.

FIG. 4 is an equivalent circuit diagram of the event pixel 20-I.

As illustrated, the event pixel 20-I includes a photodiode PD as a photoelectric conversion element, and also includes an event transfer transistor Qti, a logarithmic conversion unit 22, a buffer 23, an event detection circuit 24, a transistor Qp, a first event selection transistor Qsip, a transistor Qm, and a second event selection transistor Qsim.

Note that various transistors included in the event pixel 20-I are also constituted by, for example, MOSFETs.

Furthermore, as the above-described control lines Lc, a control line Lc4 for transmitting an event transfer drive signal TG-I, a control line Lc5 for transmitting a reference level reset signal RST-I, and a control line Lc6 for transmitting an event selection signal SLC-I are wired to the event pixel 20-I.

The gate of the event transfer transistor Qti is connected to the control line Lc4, and when the event transfer drive signal TG-I supplied from the control line Lc4 is turned on, the event transfer transistor Qti becomes conductive and transfers the charge accumulated in the photodiode PD to the logarithmic conversion unit 22.

The logarithmic conversion unit 22 converts the photocurrent (current corresponding to the amount of received light) obtained by the photodiode PD into a logarithmic voltage signal.

The buffer 23 corrects the voltage signal input from the logarithmic conversion unit 22 and outputs the corrected voltage signal to the event detection circuit 24.

As illustrated, the logarithmic conversion unit 22 includes a transistor Q1, a transistor Q2, and a transistor Q3. In this example, the transistor Q1 and the transistor Q3 are N-type transistors, and the transistor Q2 is a P-type transistor.

The source of the transistor Q1 is connected to the cathode of the photodiode PD via the event transfer transistor Qti and the drain thereof is connected to a power supply terminal (reference potential VDD).

The transistor Q2 and the transistor Q3 are connected in series between the power supply terminal and the ground terminal. Furthermore, a connection point between the transistor Q2 and the transistor Q3 is connected to the gate of the transistor Q1 and an input terminal of the buffer 23 (the gate of a transistor Q5 to be described later). Furthermore, a predetermined bias voltage Vbias is applied to the gate of the transistor Q2.

The drains of the transistor Q1 and the transistor Q3 are connected to the power supply side (reference potential VDD) to form a source follower circuit. The photocurrent from the photodiode PD is converted into a logarithmic voltage signal by these two source followers connected in the loop shape. In addition, the transistor Q2 supplies a constant current to the transistor Q3.

The buffer 23 includes a transistor Q4 and a transistor Q5 which are P-type transistors, and the transistors Q4 and Q5 are connected in series between the power supply terminal and the ground terminal.

A connection point between the transistor Q4 and the transistor Q5 is used as an output terminal of the buffer 23, and a corrected voltage signal is output from the output terminal to the event detection circuit 24 as a light reception signal.

The event detection circuit 24 detects a change in the amount of received light as an event by obtaining a difference from the current level of the light reception signal using the past level of the light reception signal as a reference level Lref. Specifically, the event detection circuit 24 detects the presence or absence of an event on the basis of whether or not the level (absolute value) of a difference signal representing the difference between the reference level Lref and the current level of the light reception signal is equal to or greater than a predetermined threshold value.

The event detection circuit 24 of this example is configured to be able to separately detect an event in which the amount of received light changes to the increase side, that is, an event in which the difference from the reference level Lref becomes positive (hereinafter referred to as a "first polarity event") and an event in which the amount of received light changes to the decrease side, that is, an event in which the difference from the reference level Lref becomes negative (hereinafter referred to as a "second polarity event").

The event detection circuit 24 outputs a signal indicating a detection result of the first polarity event as a first polarity event signal Vop, and outputs a signal indicating a detection result of the second polarity event as a second polarity event signal Vom.

Here, the event detection circuit 24 resets the reference level Lref to the current level of the light reception signal on the basis of the reference level reset signal RST-I input via the control line Lc5. By resetting the reference level Lref in this manner, it is possible to detect a new event on the basis of a change in the light reception signal level from the time point when the reset is performed. That is, the resetting of the reference level Lref functions as processing for controlling the event detection circuit 24 to a state in which a new event can be detected.

Note that an internal circuit configuration example of the event detection circuit 24 will be described again.

The transistor Qp, the first event selection transistor Qsip, the transistor Qm, and the second event selection transistor Qsim function as selection output circuits for the first polarity event signal Vop and the second polarity event signal Vom, respectively.

Here, in this example, a first event vertical signal line Lip and a second event vertical signal line Lim are provided as the event vertical signal line Li from the relationship of detecting the first polarity event signal Vop and the second polarity event signal Vom as the event signals.

As illustrated, the transistor Qp and the first event selection transistor Qsip are connected in series between the first event vertical signal line Lip and the ground terminal, and the first polarity event signal Vop is supplied to the gate of the transistor Qp.

Further, the transistor Qm and the second event selection transistor Qsim are connected in series between the second event vertical signal line Lim and the ground terminal, and the second polarity event signal Vom is supplied to the gate of the transistor Qm.

The gate of the first event selection transistor Qsip and the gate of the second event selection transistor Qsim each are connected to the control line Lc6.

When the event selection signal SLC-I supplied from the control line Lc6 to the gate of the first event selection transistor Qsip is turned on, the first event selection transistor Qsip becomes conductive and outputs the first polarity event signal Vop to the first event vertical signal line Lip.

When the event selection signal SLC-I supplied from the control line Lc6 to the gate of the second event selection transistor Qsim is turned on, the second event selection transistor Qsim becomes conductive and outputs the second polarity event signal Vom to the second event vertical signal line Lim.

In the event pixel 20-I, the event transfer drive signal TG-I is turned on, a light reception signal corresponding to the accumulated charge of the photodiode PD is input to the event detection circuit 24, and the first polarity event signal Vop and the second polarity event signal Vom are generated. When the first polarity event signal Vop and the second polarity event signal Vom are read, the event selection signal is turned on, and the first polarity event signal Vop and the second polarity event signal Vom are output to the first event vertical signal line Lip and the second event vertical signal line Lim, respectively.

Figure 5:
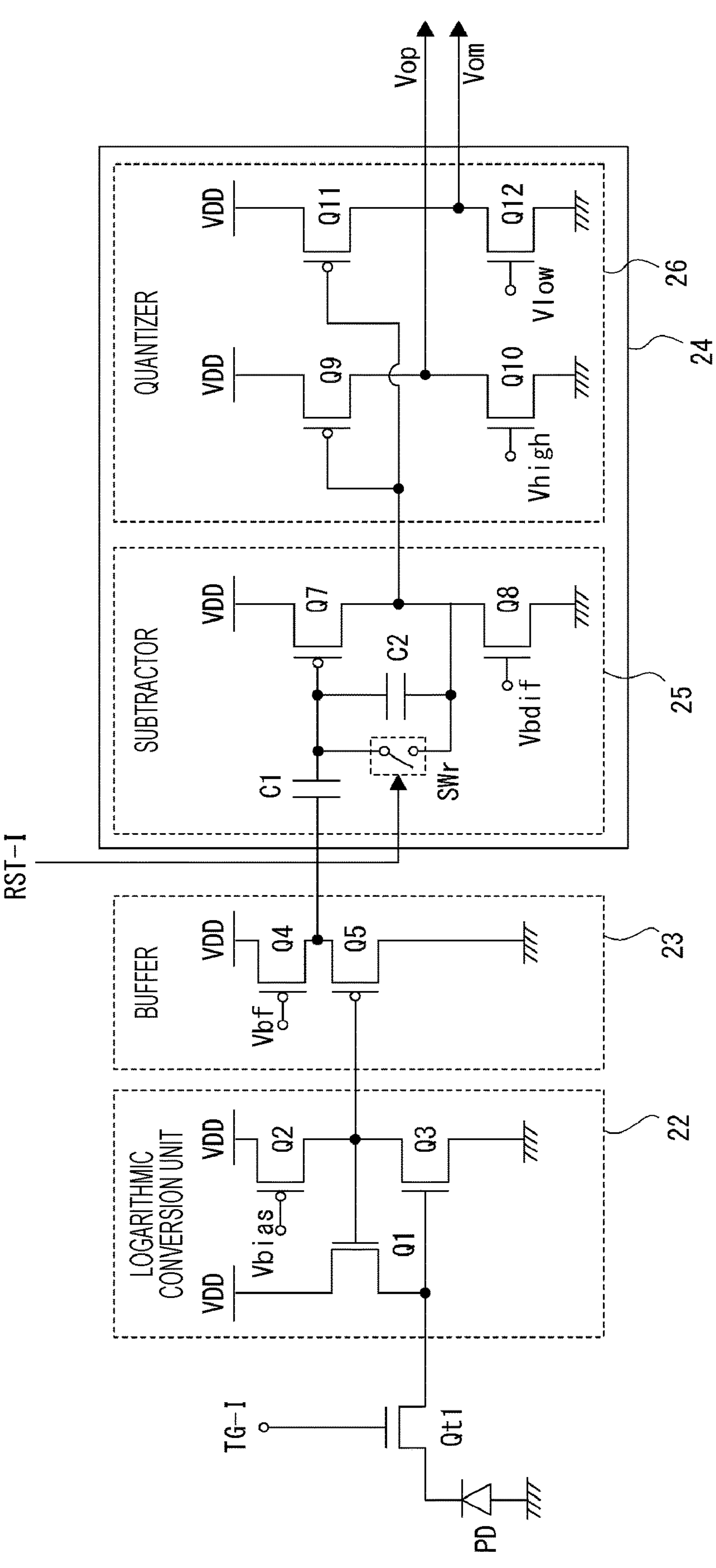
FIG. 5 is an explanatory diagram of an internal configuration example of an event detection circuit in the embodiment.

FIG. 5 is an explanatory diagram of an internal configuration example of the event detection circuit 24, and illustrates the photodiode PD, the logarithmic conversion unit 22, and the buffer 23 together with the internal circuit configuration example of the event detection circuit 24.

As illustrated, the event detection circuit 24 includes a subtractor 25 and a quantizer 26.

The subtractor 25 reduces the level of the light reception signal (voltage signal) from the buffer 23 in accordance with the reference level reset signal RST-I. The subtractor 25 outputs the reduced light reception signal to the quantizer 26.

The quantizer 26 quantizes the light reception signal from the subtractor 25 into a digital signal and outputs the digital signal as an event signal (in this example, the first polarity event signal Vop and the second polarity event signal Vom).

The subtractor 25 includes a capacitor C1 and a capacitor C2, a transistor Q7 and a transistor Q8, and a reset switch SWr. The transistor Q7 is a P-type transistor, and the transistor Q8 is an N-type transistor.

The transistor Q7 and the transistor Q8 are connected in series between the power supply terminal and the ground terminal to form an inverter. Specifically, the source of the transistor Q7 is connected to the power supply terminal, the drain thereof is connected to the drain of the transistor Q8, and the source of the transistor Q8 is connected to the ground terminal. Note that a voltage Vbdif is applied to the gate of the transistor Q8.

The capacitor C1 has one end connected to the output terminal of the buffer 23 and the other end connected to the gate (input terminal of the inverter) of the transistor Q7. The capacitor C2 has one end connected to the other end of the capacitor C1 and the other end connected to a connection point between the transistor Q7 and the transistor Q8.

The reset switch SWr has one end connected to a connection point between the capacitor C1 and the capacitor C2 and the other end connected to a connection point between the capacitor C2 and the connection point between the transistor Q7 and the transistor Q8, and is connected in parallel to the capacitor C2. The reset switch SWr is a switch that is turned on/off in accordance with the reference level reset signal RST-I.

The inverter formed by the transistor Q7 and the transistor Q8 inverts the light reception signal input via the capacitor C1 and outputs the inverted light reception signal to the quantizer 26.

Here, in the subtractor 25, the potential generated on the buffer 23 side of the capacitor C1 at a certain point of time is assumed to be a potential Vinit. Then, at this time, it is assumed that the reset switch SWr is turned on. In a case where the reset switch SWr is ON, the side of the capacitor C1 opposite to the buffer 23 serves as a virtual ground terminal. The potential of the virtual ground terminal is assumed to be zero for convenience. At this time, when the capacitance of the capacitor C1 is denoted by Cp1, a charge CHinit accumulated in the capacitor C1 is expressed by the following [Expression 1].

$$CHinit = Cp1 \times Vinit \qquad \text{[Expression 1]}$$

In addition, when the reset switch SWr is ON, both ends of the capacitor C2 are short-circuited, so that the accumulated charge is zero.

Next, it is assumed that the reset switch SWr is turned off. If there is a change in the amount of received light, the potential on the buffer 23 side of the capacitor C1 is changed from Vinit described above. When the potential after the change is denoted by Vafter, a charge CHafter accumulated in the capacitor C1 is expressed by the following [Expression 2].

$$CHafter = Cp1 \times Vafter \qquad \text{[Expression 2]}$$

On the other hand, when the capacitance of the capacitor C2 is denoted by Cp2 and the output voltage of the subtractor 25 is denoted by Vout, a charge CH2 accumulated in the capacitor C2 is expressed by the following [Expression 3].

$$CH2 = -Cp2 \times Vout \qquad \text{[Expression 3]}$$

At this time, since the total charge amount of the capacitors C1 and C2 does not change, the following [Expression 4] is established.

$$CHinit = CHafter + CH2 \qquad \text{[Expression 4]}$$

By substituting [Expression 1] to [Expression 3] into [Expression 4] and transforming it, the following [Expression 5] is obtained.

$$Vout = -(Cp1/Cp2) \times (Vafter - Vinit) \qquad \text{[Expression 5]}$$

[Expression 5] represents a subtraction operation of the voltage signal, and the gain of the subtraction result is Cp1/Cp2.

From this [Expression 5], it can be seen that the subtractor 25 outputs a signal representing a difference between the past level (Vinit) of the light reception signal and the current level (Vafter) of the light reception signal.

Here, the potential Vinit corresponds to the reference level Lref described above. From the above description, when the reset switch SWr is turned on, the potential Vinit, that is, the reference level Lref is reset to the current level of the light reception signal, in other words, the level of the light reception signal at the time when the reset switch SWr is turned on.

The quantizer 26 includes a transistor Q9, a transistor Q10, a transistor Q11, and a transistor Q12, and is configured as a 1.5 bit quantizer.

The transistors Q9 and Q11 are P-type transistors, and the transistors Q10 and Q12 are N-type transistors.

As illustrated, the transistor Q9 and the transistor Q10, and the transistor Q11 and the transistor Q12 are connected in series between the power supply terminal and the ground terminal, and the output voltage (Vout) of the subtractor 25 is input to each gate of the transistors Q9 and Q11. In addition, a voltage Vhigh is applied to the gate of the transistor Q10, and a voltage Vlow is applied to the gate of the transistor Q12.

A first polarity event signal Vop indicating the detection result of the first polarity event is obtained at the connection point between the transistor Q9 and the transistor Q10, and a second polarity event signal Vom indicating the detection result of the second polarity event is obtained at the connection point between the transistor Q11 and the transistor Q12.

Specifically, on the transistors Q9 and Q10 side, in a case where the level of the output voltage (Vafter−Vinit) of the subtractor 25 is equal to or higher than the positive threshold value according to the voltage Vhigh, the first polarity event signal Vop at an H level is obtained at the connection point between the transistor Q9 and the transistor Q10, and in a case where the level of the output voltage of the subtractor 25 is less than the positive threshold value, the first polarity event signal Vop at an L level is obtained. That is, at the connection point between the transistor Q9 and the transistor Q10, the signal indicating whether or not the amount of received light has changed by a predetermined threshold value or more in the increasing direction, that is, the first polarity event signal Vop indicating the detection result of the first polarity event is obtained.

Further, on the transistors Q11 and Q12 side, in a case where the level of the output voltage of the subtractor 25 is equal to or lower than the negative threshold value according to the voltage Vlow, the second polarity event signal Vom at the H level is obtained at the connection point between the transistor Q11 and the transistor Q12, and in a case where the level of the output voltage of the subtractor 25 is larger than the negative threshold value, the second polarity event signal Vom at the L level is obtained. In this manner, at the connection point between the transistor Q11 and the transistor Q12, the signal indicating whether or not the amount of received light has changed by a predetermined threshold value or more in the decreasing direction, that is, the second polarity event signal Vom indicating the detection result of the second polarity event is obtained.

[1-3. Pixel Structure as First Embodiment]

A pixel structure of the pixel array unit 2 according to the first embodiment will be described with reference to FIGS. 6 and 7.

Figure 6:
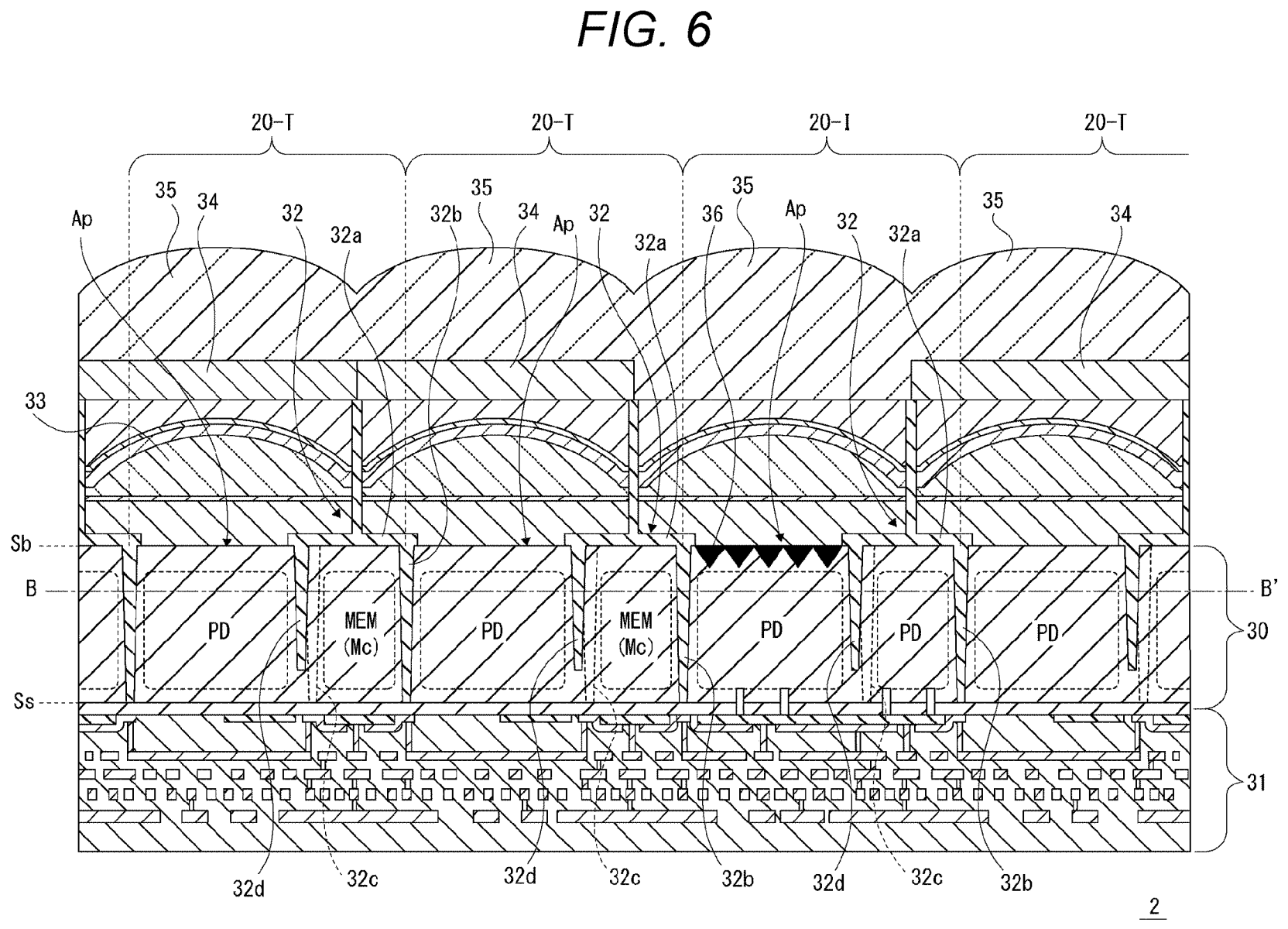
Figure 7:
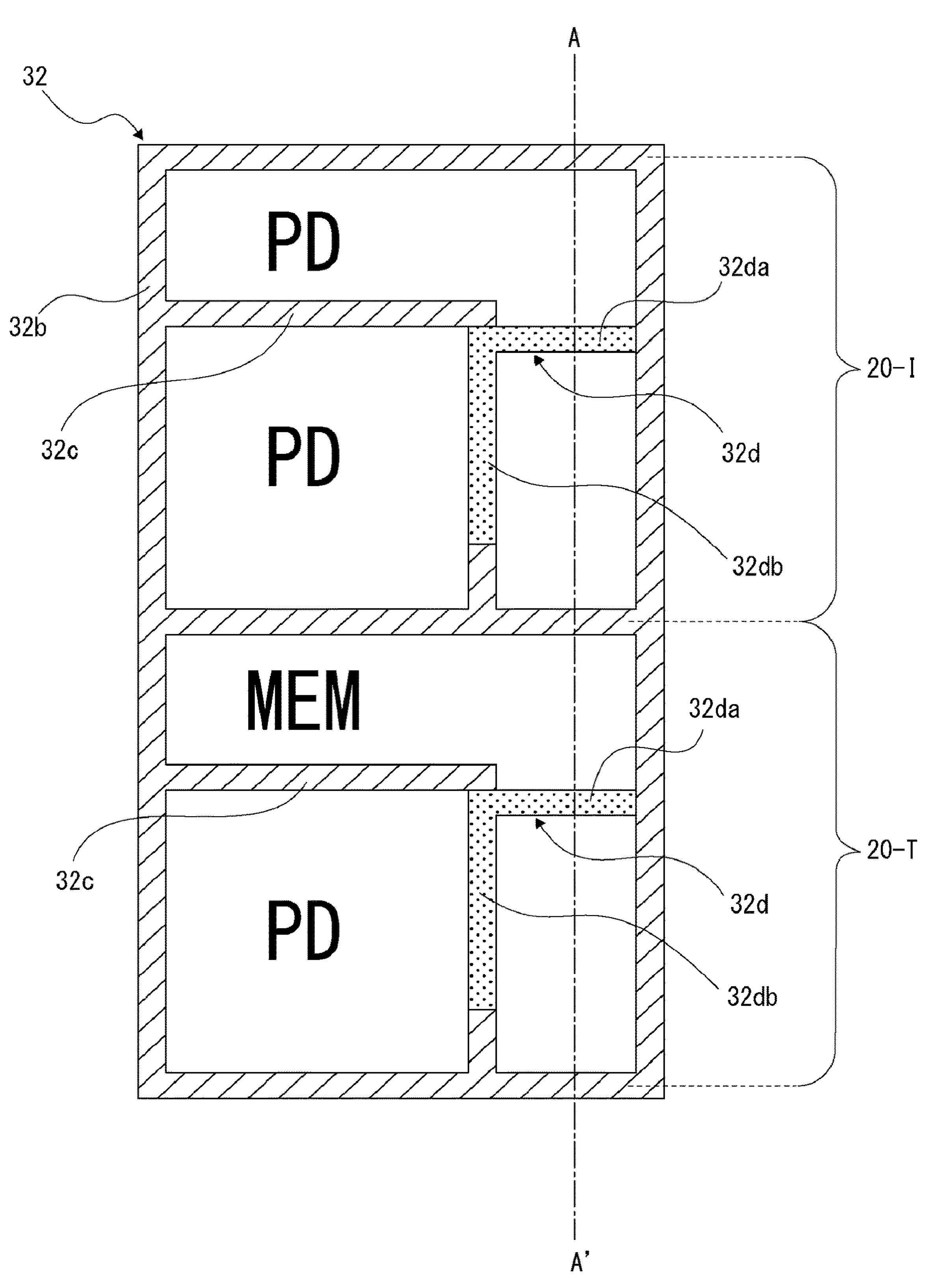
FIG. 7 is a diagram illustrating a schematic transverse cross-sectional structure of a pixel array unit in the first embodiment.

FIG. 6 is a diagram illustrating a schematic longitudinal cross-sectional structure of the pixel array unit 2, and FIG. 7 is a diagram illustrating a schematic transverse cross-sectional structure of the pixel array unit 2.

FIG. 7 illustrates a schematic transverse cross-sectional structure of a partial region adjacent to the gradation pixel 20-T and the event pixel 20-I in the pixel array unit 2. The longitudinal cross-sectional view of FIG. 6 illustrates a schematic longitudinal cross-sectional structure obtained by cutting the pixel array unit 2 along a cutting plane A-A' (a plane parallel to the thickness direction of the solid-state imaging element) illustrated in FIG. 7, and the transverse cross-sectional view of FIG. 7 illustrates a schematic transverse cross-sectional structure obtained by cutting the pixel array unit 2 along a cutting plane B-B' (a plane orthogonal to the above-described thickness direction) illustrated in FIG. 6.

First, the solid-state imaging element 1 of this example is a back-illuminated solid-state imaging element. In the back-illuminated solid-state imaging element 1, as illustrated in FIG. 6, a wiring layer 31 is formed on a front surface Ss side of a semiconductor substrate 30 on which a photodiode PD that performs photoelectric conversion is formed, and a color filter 34 as an on-chip filter and a microlens 35 as an on-chip lens are formed on a back surface Sb side of the semiconductor substrate 30.

The semiconductor substrate 30 is, for example, a silicon (Si) substrate. In the semiconductor substrate 30, a photodiode PD is formed for each pixel 20 of the gradation pixel 20-T and the event pixel 20-I.

Furthermore, a light shielding film 32 for preventing leakage of light is formed on the semiconductor substrate 30 (see both FIGS. 6 and 7). The light shielding film 32 includes, for example, a metal having a light shielding property such as tungsten.

The light shielding film 32 includes a plane-direction film portion 32*a*, a first wall portion 32*b*, a second wall portion 32*c*, and a third wall portion 32*d*. The plane-direction film portion 32*a* is a light shielding film portion formed parallel to a plane orthogonal to the thickness direction on the back surface Sb side of the semiconductor substrate 30.

The plane-direction film portion 32*a* is formed to have an opening Ap (that is, a portion where the plane-direction film portion 32*a* is not formed) corresponding to the formation region of the photodiode PD of each pixel 20 on the back surface Sb of the semiconductor substrate 30. That is, the plane-direction film portion 32*a* is formed to have an opening Ap (a portion where the plane-direction film portion 32*a* is not formed) in a region overlapping the formation region of the photodiode PD of each pixel 20 in the region on the back surface Sb.

Hereinafter, the opening Ap is referred to as an "optical opening Ap."

The first wall portion 32*b*, the second wall portion 32*c*, and the third wall portion 32*d* are each formed as a light shielding film portion protruding in the substrate thickness direction from the plane-direction film portion 32*a* toward the front surface Ss side of the semiconductor substrate 30. The first wall portion 32*b* is a portion for preventing leakage of light between the pixels 20 in the semiconductor substrate 30, and is formed in a grid shape so as to separate the pixels 20 (particularly, see FIG. 7).

The second wall portion 32*c* is formed to separate the formation region of the photodiode PD and the formation region of the memory element (MEM) Mc in the gradation pixel 20-T. However, as illustrated in FIG. 7, the second wall portion 32*c* is not formed to completely divide the formation region of the photodiode PD and the formation region of the memory element Mc, and is formed to separate only a part of both regions. Specifically, as illustrated in FIG. 7, the second wall portion 32*c* is formed to protrude from one side of the first wall portion 32*b* toward a side opposite to the one side (hereinafter referred to as "opposite side"), but is formed not to contact the opposite side.

Note that, according to the A-A' cutting plane illustrated in FIG. 7, in the longitudinal cross-sectional view of FIG. 6, the second wall portion 32*c* exists on the back side of the paper surface and does not appear on the paper surface, but in FIG. 6, the existence position of the second wall portion 32*c* is indicated by a dotted line for convenience.

The third wall portion 32*d* is formed to separate a region that is not separated by the second wall portion 32*c* between the photodiode PD and the memory element Mc in the gradation pixel 20-T in the transverse cross section illustrated in FIG. 7.

Specifically, the third wall portion 32*d* in this example has, in the transverse cross section illustrated in FIG. 7, a first portion 32*da* which is a portion protruding toward one side from the opposite side of the one side and the opposite side of the first wall portion 32*b* described above and a second portion 32*db* which is bent at substantially a right angle from the tip of the first portion 32*da* and is formed to divide the formation region of the photodiode PD by two regions. Since the tip of the first portion 32*da* abuts on the tip of the second wall portion 32*c*, a region which is not separated by the second wall portion 32*c* between the photodiode PD and the memory element Mc is separated.

Here, in the light shielding film 32, each of the first wall portion 32*b*, the second wall portion 32*c*, and the third wall portion 32*d* protruding in the substrate thickness direction is formed as a reverse trench isolation (RTI). The RTI is a trench isolation generated by forming a groove extending to the front surface Ss by cutting the semiconductor substrate 30 from the back surface Sb side.

Here, in this example, a groove for separation in the semiconductor substrate is referred to as a "trench," but this trench is interpreted as a groove for the semiconductor substrate even in a case where the inside is filled with a predetermined material.

In this example, the first wall portion 32*b* for light shielding between pixels and the second wall portion 32*c* integrally formed with the first wall portion 32*b* are each formed by a reverse full trench isolation (RFTI). The RFTI is a trench generated by forming a groove penetrating the semiconductor substrate 30 in the thickness direction among the RTIs, and functions as a light shielding portion penetrating from the back surface Sb to the front surface Ss.

On the other hand, the third wall portion 32*d* is formed by a non-penetrating RTI, that is, an RTI with a depth not penetrating to the front surface Ss (hereinafter referred to as a "non-penetrating RTI").

In this manner, in this example, the second wall portion 32*c* is formed by the RFTI as a penetrating RTI, and the third wall portion 32*d* is formed by a non-penetrating RTI. The reason why the second wall portion 32*c*, that is, the trench mainly separating the formation region of the photodiode PD and the memory element Mc is formed as the penetrating RTI is to reduce the amount of light incident on the photodiode PD directly or indirectly leaking to the memory element Mc side.

At this time, by providing a trench as the third wall portion 32*d*, the effect of preventing such leakage of light can be enhanced, but by forming the third wall portion 32*d* not as an RFTI but as a non-penetrating RTI, charge transfer from the photodiode PD to the memory element Mc is facilitated while enhancing the effect of suppressing leakage of light from the photodiode PD to the memory element Mc side.

Here, the width of the trench tends to gradually narrow in the direction in which the groove is cut, that is, in the direction from the back surface Sb to the front surface Ss in the case of cutting from the back surface Sb as in RTI. For this reason, the RTI is formed such that the width gradually narrows from the back surface Sb side toward the front surface Ss side of the semiconductor substrate 30 (see FIG. 6).

Regarding the structure of the light shielding film 32, only the structure of the light shielding film 32 formed in the gradation pixel 20-T has been described above, but in this example, the light shielding film 32 having a similar structure is also formed in the event pixel 20-I. Specifically, in this example, the light shielding film 32 for the event pixel 20-I is formed in the same pattern as the light shielding film 32 for the gradation pixel 20-T at least in the transverse cross-sectional view illustrated in FIG. 7.

In this manner, the light shielding film 32 can be efficiently formed by sharing the formation pattern of the light shielding film 32 between the gradation pixel 20-T and the event pixel 20-I, and the manufacturing efficiency of the solid-state imaging element 1 can be improved.

Note that the structure of the event pixel 20-I inside the semiconductor substrate 30 will be described later again.

The wiring layer 31 is formed by alternately stacking an insulating layer having an electrical insulating function and a wiring formation layer on the front surface Ss of the semiconductor substrate 30.

Note that, although illustration is omitted, electrodes and the like of various pixel transistors included in the gradation pixel 20-T and the event pixel 20-I are formed at a boundary portion between the semiconductor substrate 30 and the wiring layer 31. Specifically, for the gradation pixel 20-T, a metal film, an insulating film, and the like that function as a gate electrode in the memory element Mc as a MOS capacitor or electrodes of various pixel transistors such as the gradation transfer transistor Qtt and the reset transistor Qr (each electrode of gate, source, and drain) are formed. Furthermore, for the event pixel 20-I, an electrode, an insulating film, and the like of the above-described event transfer transistor Qti are formed.

In addition, in the wiring layer 31, various control lines Lc such as the control line Lc1 of the gradation transfer drive signal TG-T, the control line Lc2 of the charge reset signal RST-T, and the control line Lc4 of the event transfer drive signal TG-I, and various wirings serving as the gradation vertical signal line Lt, which are described above, are formed.

On the back surface Sb side of the semiconductor substrate 30, an optical waveguide structure portion 33 for guiding light to the optical opening Ap is formed on the optical opening Ap and on the plane-direction film portion 32*a* of the light shielding film 32.

Then, a color filter layer is provided on the optical waveguide structure portion 33, and in the color filter layer, a color filter 34 is formed for a region of each gradation pixel 20-T. The color filter 34 is a filter (in this example, any one of R, G, and B filters) that transmits light in a visible light band. Furthermore, in this example, no color filter is formed for the event pixel 20-I. Note that it is also possible to employ a configuration in which a color filter (wavelength selection filter) is provided for the event pixel 20-I. For example, in a case where the event pixel 20-I is caused to receive IR light as in this example, it is possible to employ a configuration in which a filter that transmits light in a wavelength band of IR light is provided.

Moreover, on the color filter layer, a microlens layer in which the microlens 35 for each pixel 20 is provided is formed.

Here, in the present embodiment, the pixel array unit 2 has the following features regarding the structure of the event pixel 20-I. That is, in the event pixel 20-I according to the embodiment, the same intra-pixel region as the region where the memory element Mc is formed in the gradation pixel 20-T in the intra-pixel region is used as a formation region of the photodiode PD (see FIGS. 6 and 7).

Specifically, in the event pixel 20-I, the photodiode PD is formed in the same intra-pixel region as the region where the photodiode PD is formed in the gradation pixel 20-T in the intra-pixel region, and the photodiode PD is further formed in the same intra-pixel region as the region where the memory element Mc is formed in the gradation pixel 20-T.

By employing such a structure, in the event pixel 20-I, the volume of the photodiode PD is enlarged more than that of the gradation pixel 20-T, and the light receiving sensitivity of the event pixel 20-I is improved.

Note that, in the following description, regarding the intra-pixel region separated by the trench formed similarly to the gradation pixel 20-T in the event pixel 20-I, the same intra-pixel region as the region where the photodiode PD is formed (region where light is directly incident from the optical opening Ap) in the gradation pixel 20-T is referred to as a "first intra-pixel region." Furthermore, in the gradation pixel 20-T, the same intra-pixel region as the region where the memory element Mc is formed (region where light enters from the optical opening Ap via the first intra-pixel region) is referred to as a "second intra-pixel region."

Here, in a case where the outer surface of the light shielding film 32 functions as a light reflecting surface because the light shielding film 32 includes metal or the like as in this example, by employing the similar structure of the light shielding film 32 in the gradation pixel 20-T and the event pixel 20-I, the light receiving sensitivity can be improved as compared with a case where the volume of the photodiode PD is simply enlarged. Specifically, by employing the similar structure of the light shielding film 32 in the gradation pixel 20-T and the event pixel 20-I, in the event pixel 20-I, since the second intra-pixel region is a region surrounded in a substantially private room shape by the plane-direction film portion 32*a*, the first wall portion 32*b*, and the second wall portion 32*c*, the effect of confining the light incident from the first intra-pixel region side in the second pixel region can be enhanced, and the light receiving sensitivity of the event pixel 20-I is improved.

Furthermore, in this example, in the event pixel 20-I, the depth of the third wall portion 32*d* (non-penetrating RTI) in the light shielding film 32 is shallower than that of the third wall portion 32*d* in the gradation pixel 20-T (see FIG. 7). Here, the third wall portion 32*d* is a trench separating the photodiode PD and the memory element Mc from each other in the gradation pixel 20-T, but is a trench separating the inside of the formation region of the photodiode PD in the event pixel 20-I.

As described above, by reducing the depth of the trench separating the inside of the formation region of the photodiode PD in the third wall portion 32*d*, that is, the event pixel 20-I, light easily enters the second intra-pixel region side from the first intra-pixel region side.

Therefore, the amount of light incident on the second intra-pixel region can be increased, and the light receiving sensitivity of the event pixel 20-I can be improved.

Moreover, in the event pixel 20-I in the present embodiment, a refractive index grating (RIG) 36 is formed between the microlens 35 and the formation region of the photodiode PD in the thickness direction of the semiconductor substrate 30. The refractive index grating has an uneven shape on the front surface of the semiconductor substrate, which is also called a moth-eye structure.

In this example, since the formation region of the photodiode PD is separated into the first intra-pixel region and the second intra-pixel region by the light shielding film 32, the second intra-pixel region is separated into a substantially private room shape, and only the light passing through the first intra-pixel region is incident on the second intra-pixel region, the refractive index grating 36 is formed between the microlens 35 and the photodiode PD in the first intra-pixel region. Specifically, in this example, the refractive index grating 36 is formed in a region overlapping a formation region of the optical opening Ap in a region on the back surface Sb of the semiconductor substrate 30.

By providing such a refractive index grating 36, in the event pixel 20-I, light via the microlens 35 can be scattered and made incident on the photoelectric conversion portion (in this case, the formation region of the photodiode PD in the first intra-pixel region).

Therefore, the optical path length of the light traveling in the photoelectric conversion portion in the event pixel 20-I can be extended, and the light receiving sensitivity of the event pixel 20-I can be improved.

2. Second Embodiment

Next, a second embodiment will be described with reference to FIGS. 8, 9, 10A, 10B, 10C, 10D, and 11.

In the second embodiment, an intra-region trench is formed in a second intra-pixel region.

Note that, in the following description, the same reference numerals are given to portions similar to those already described, and description thereof will be omitted.

Figure 8:
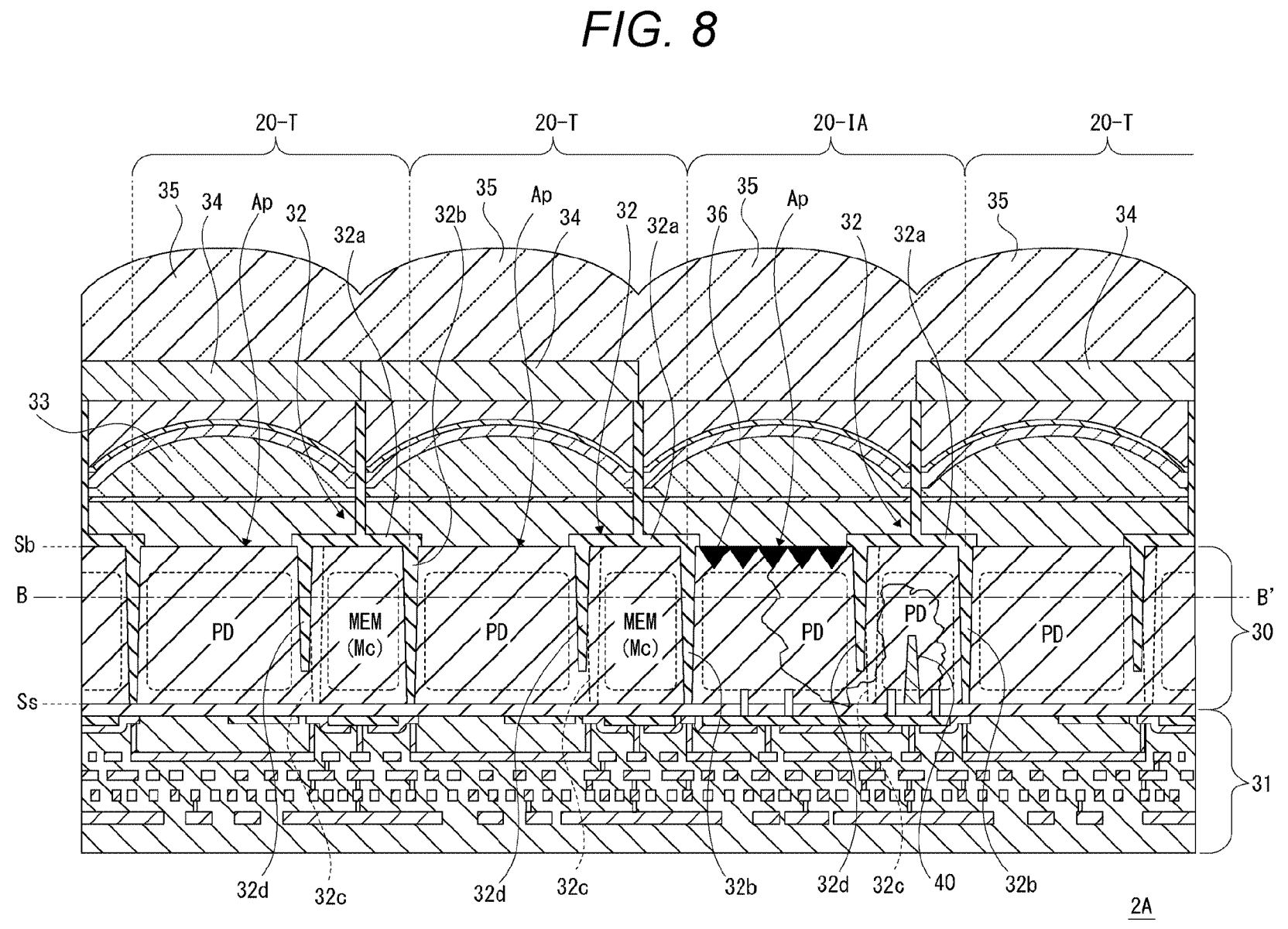
Figure 9:
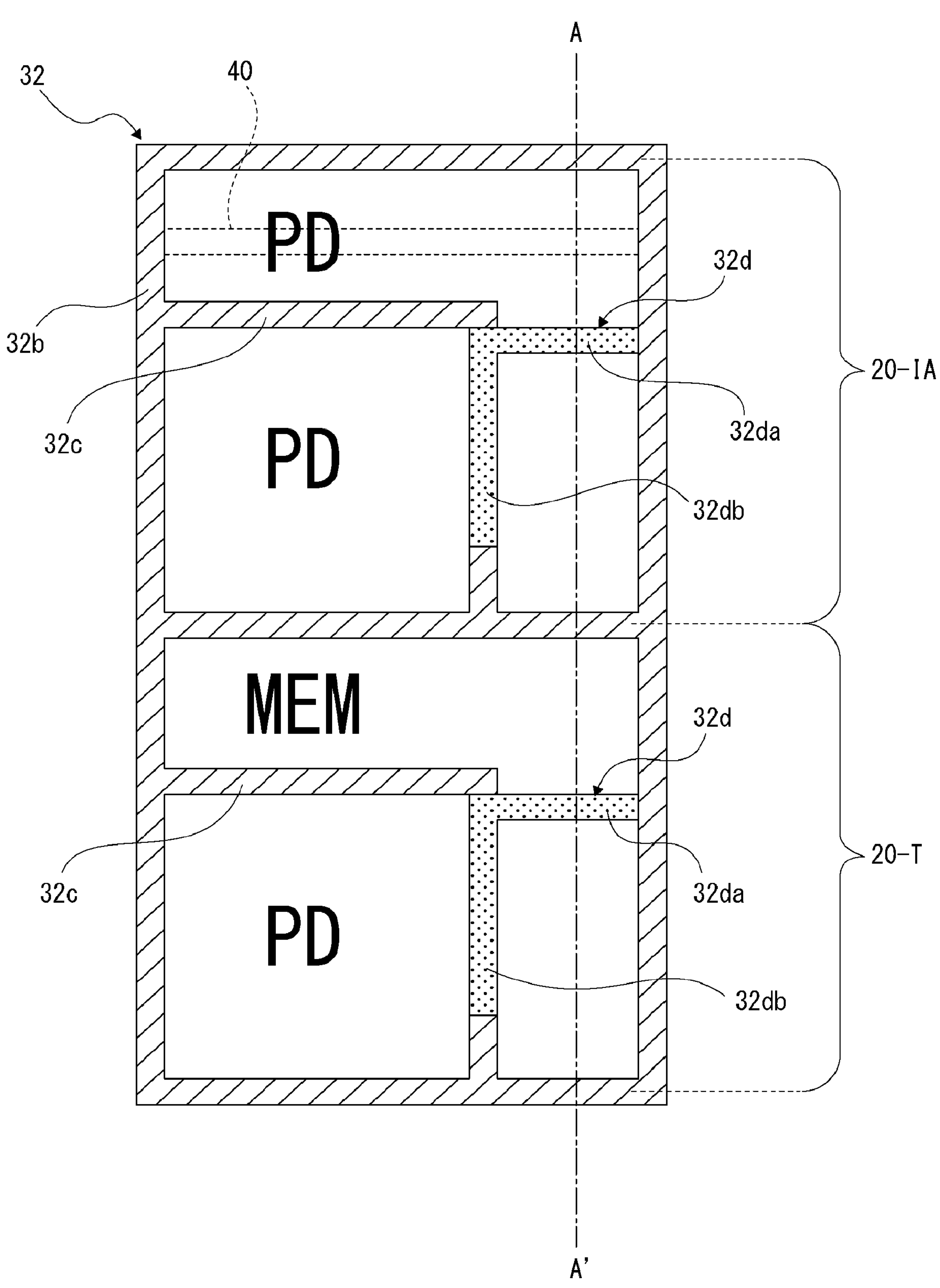
FIG. 9 is a diagram illustrating a schematic transverse cross-sectional structure of a pixel array unit as the second embodiment.

FIG. 8 is a diagram illustrating a schematic longitudinal cross-sectional structure of a pixel array unit 2A as the second embodiment, and FIG. 9 is a diagram illustrating a schematic transverse cross-sectional structure of the pixel array unit 2A. Note that FIGS. 8 and 9 illustrate a schematic longitudinal cross-sectional structure and a schematic transverse cross-sectional structure of the pixel array unit 2A in the same manner as in FIGS. 6 and 7 described above, respectively.

The pixel array unit 2A of the second embodiment is different from the pixel array unit 2 in that an event pixel 20-IA is formed instead of the event pixel 20-I.

The event pixel 20-IA is different from the event pixel 20-I in that a partition wall portion 40 is formed by a trench in a second intra-pixel region, that is, in a substantially private room region surrounded by the plane-direction film portion 32*a*, the first wall portion 32*b*, the second wall portion 32*c*, and the third wall portion 32*d* (the first portion 32*da*) of the light shielding film 32.

In this example, the partition wall portion 40 is formed by a non-penetrating front trench isolation (FTI). The FTI is a trench formed by digging a groove by cutting the semiconductor substrate 30 from the front surface Ss side. Therefore, as illustrated in FIG. 8, the width of the partition wall portion 40 narrows from the front surface Ss side toward the back surface Sb side.

As illustrated in FIG. 9, the partition wall portion 40 by a non-penetrating FTI is formed as a wall portion extending substantially parallel to the second wall portion 32*c* in this example, and partitions the inside of the second intra-pixel region of the event pixel 20-IA from the front surface Ss side. More specifically, the partition wall portion 40 of this example is formed to cross the entire second intra-pixel region in a direction substantially parallel to the second wall portion 32*c*, and the second intra-pixel region is divided by two regions in a direction orthogonal to the second wall portion 32*c*.

By providing the partition wall portion 40 as described above, it is possible to increase the number of light reflecting surfaces in the second intra-pixel region. At the same time, it becomes easy to confine light in the inner part of the formation region of the photodiode PD in the second intra-pixel region (it becomes difficult for light to return from the second intra-pixel region to the first intra-pixel region side).

Therefore, the optical path length of the light traveling in the photoelectric conversion portion in the event pixel 20-IA can be extended, the photoelectric conversion portion in the second intra-pixel region can be efficiently used, and the light receiving sensitivity of the pixel for event detection can be improved.

An example of a manufacturing method of the pixel array unit 2A will be briefly described with reference to FIGS. 10A, 10B, 10C, and 10D.

Figure 10A:
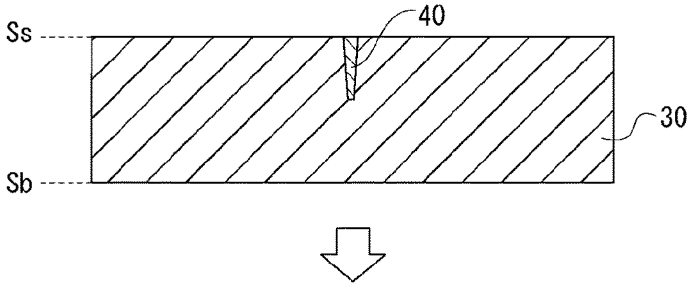
FIGS. 10A, 10B, 10C, and 10D are explanatory diagrams of an example of a manufacturing method of a pixel array unit as the second embodiment.

First, the partition wall portion 40 by a non-penetrating FTI is formed on the semiconductor substrate 30 (see FIG. 10A). Specifically, a cutting step of digging a groove from the front surface Ss side toward the back surface Sb side of the semiconductor substrate 30 is performed to form the partition wall portion 40 by the non-penetrating FTI. In this example, the trench is formed by forming a light shielding film (light reflecting film) in a groove dug in the cutting step for the semiconductor substrate 30.

Figure 10B:
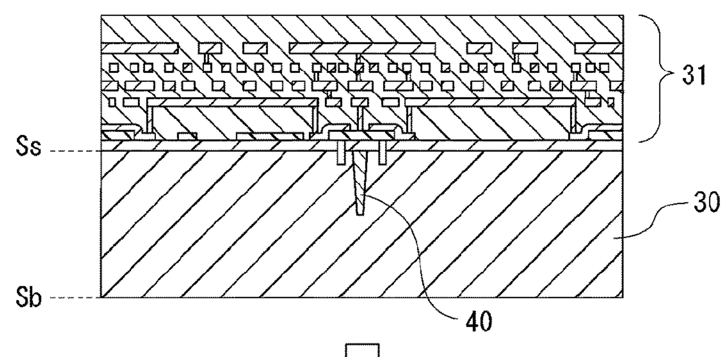
Figure 10C:
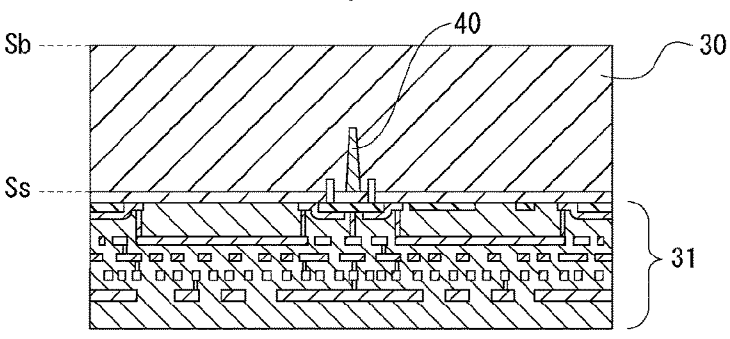

Next, the wiring layer 31 is formed on the front surface Ss of the semiconductor substrate 30 on which the partition wall portion 40 is formed (see FIG. 10B).

Figure 10D:
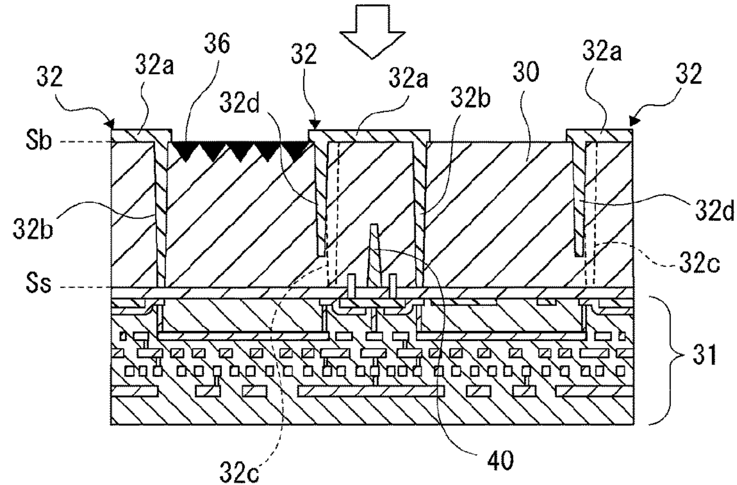

Then, the semiconductor substrate 30 on which the wiring layer 31 is formed is turned upside down (see FIG. 10C), and the light shielding film 32 and the refractive index grating 36 are formed by processing the back surface Sb side of the semiconductor substrate 30 (see FIG. 10D). The light shielding film 32 can be formed by forming grooves for creating the first wall portion 32*b*, the second wall portion 32*c*, and the third wall portion 32*d* by a cutting step on the back surface Sb side of the semiconductor substrate 30 and then forming light shielding films on these grooves and portions where the plane-direction film portions 32*a* are to be formed.

3. Third Embodiment

A third embodiment relates to a variation of the intra-region trench.

Figure 11:
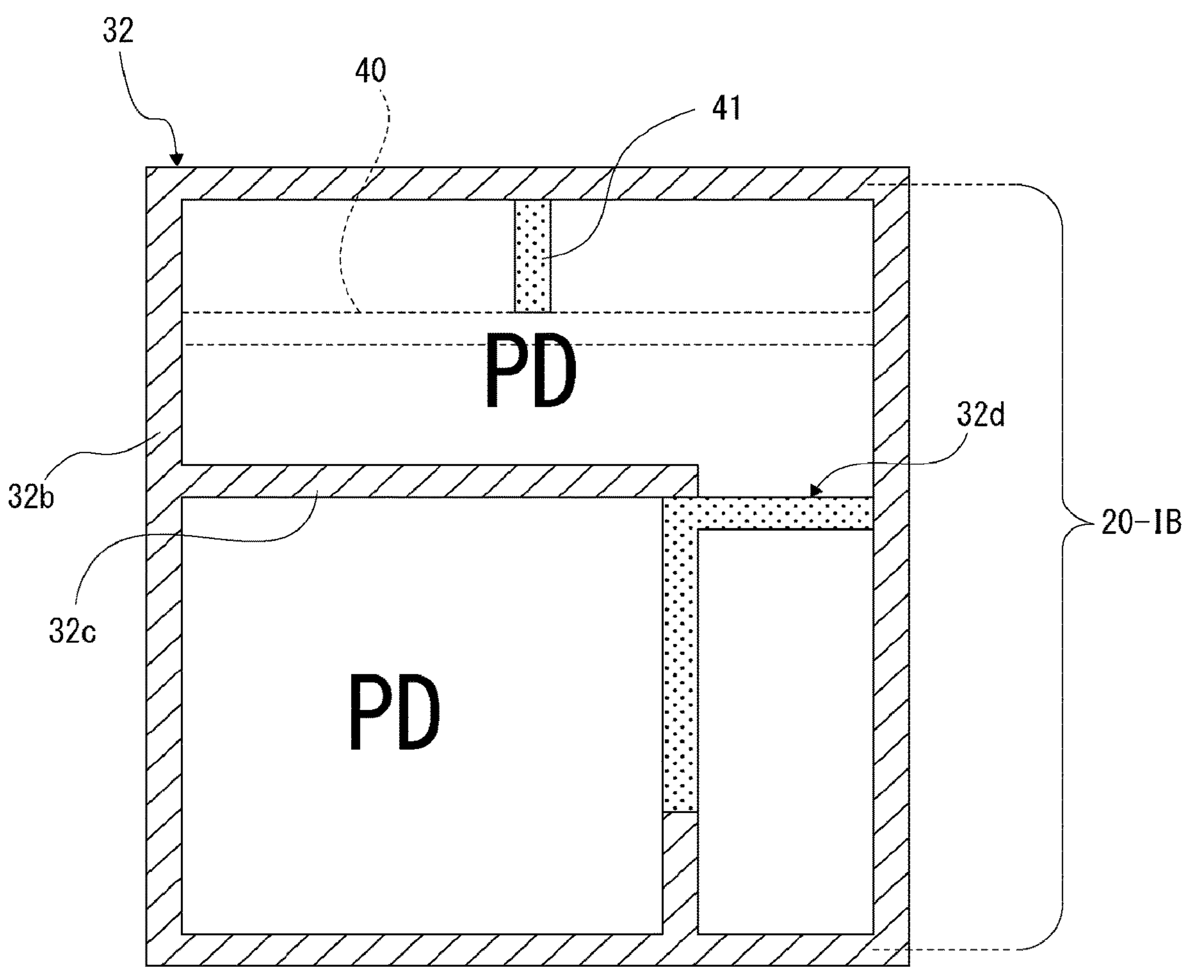
FIG. 11 is a diagram illustrating a schematic transverse cross-sectional structure of a second pixel as a first example in a third embodiment.

FIG. 11 illustrates a schematic transverse cross-sectional structure of an event pixel 20-IB as a first example in the third embodiment.

A difference from the event pixel 20-IA of the second embodiment illustrated in FIG. 9 is that a partition wall portion 41 is provided in the second intra-pixel region. In this example, the partition wall portion 41 is formed by RTI (non-penetrating RTI or RFTI).

The partition wall portion 41 in this case is formed as a wall portion extending in a direction substantially orthogonal to the partition wall portion 40 by FTI in the transverse cross-sectional view of FIG. 11, and is formed to divide one region of the regions divided by two regions by the partition wall portion 40 by two.

By providing the partition wall portion 41 as described above, the intra-region trench has four or more surfaces in the second intra-pixel region of the event pixel 20-IB.

Specifically, the surfaces of the intra-region trench in this case are a total of five or more surfaces including a total of three surfaces of the tip surface and two side surfaces of the partition wall portion 40 by FTI and at least two side surfaces of the partition wall portion 41 by RTI.

As the number of light reflecting surfaces in the second intra-pixel region increases, the optical path length of light traveling in the photoelectric conversion portion formed in the second intra-pixel region can be extended, and the light receiving sensitivity of the pixel for event detection can be improved.

Figure 12:
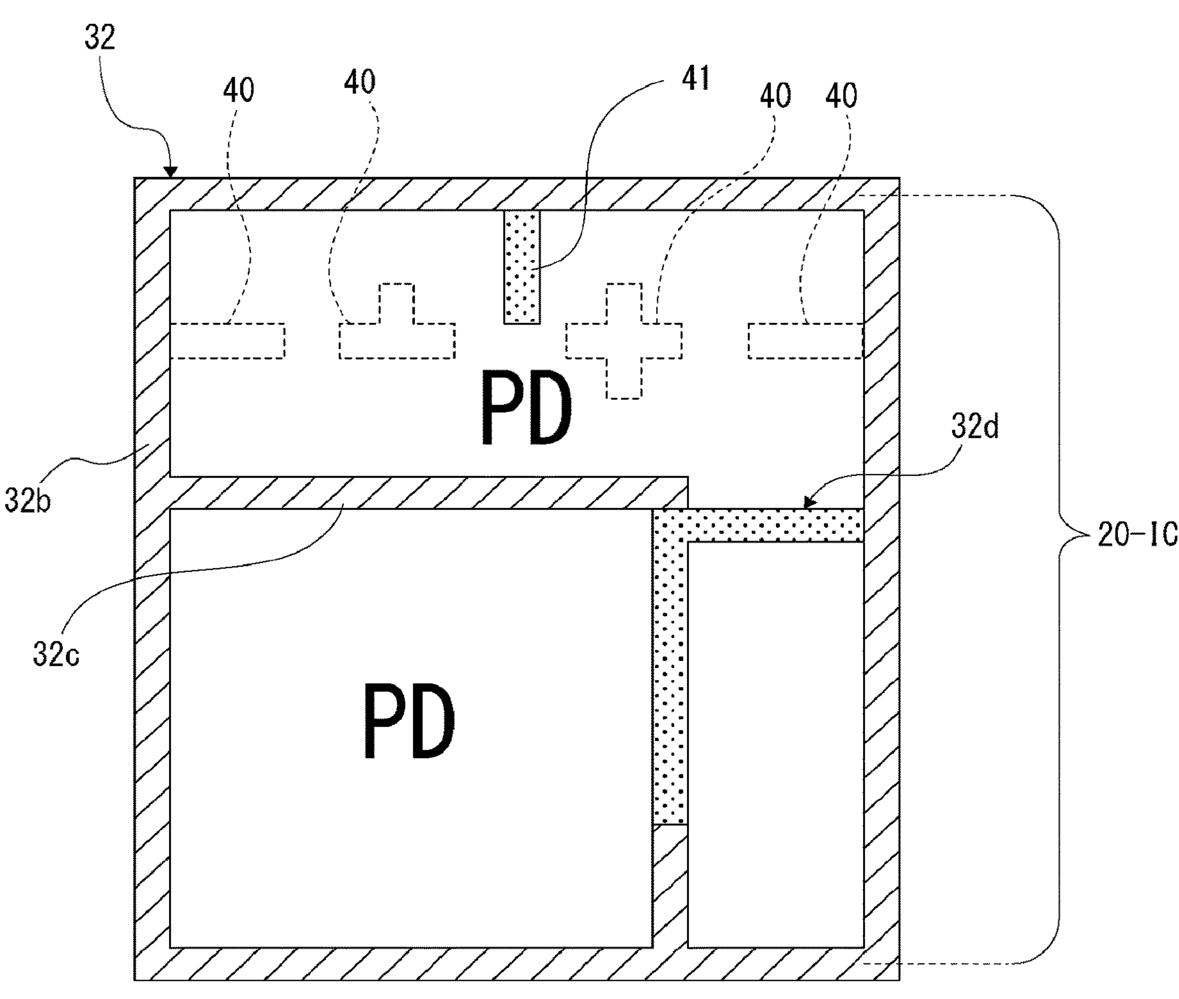
FIG. 12 is a diagram illustrating a schematic transverse cross-sectional structure of a second pixel as a second example in the third embodiment.

FIG. 12 illustrates a schematic transverse cross-sectional structure of an event pixel 20-IC as a second example in the third embodiment.

A difference from the event pixel 20-IB as the first example illustrated in FIG. 11 is that the surface of the partition wall portion 40 by FTI is increased. Specifically, in this case, at least a part of the cross-sectional shape of the partition wall portion 40 is formed to have a cross shape or a T shape.

In FIG. 12, as the event pixel 20-IC, an example is illustrated in which a plurality of partition wall portions 40 having cross-sectional shapes of an I shape, a T shape, and a cross shape is arranged in a direction substantially parallel to the second wall portion 32*c* in the second intra-pixel region.

With the above configuration, the number of light reflecting surfaces in the second intra-pixel region can be further increased, the optical path length of the light traveling in the photoelectric conversion portion formed in the second intra-pixel region can be further extended, and the light receiving sensitivity of the pixel for event detection can be further improved.

4. Fourth Embodiment

In a fourth embodiment, the size of the pixels for event detection is equivalent to the size of a plurality of pixels of the gradation pixel 20-T.

Figures 13A, 13B:
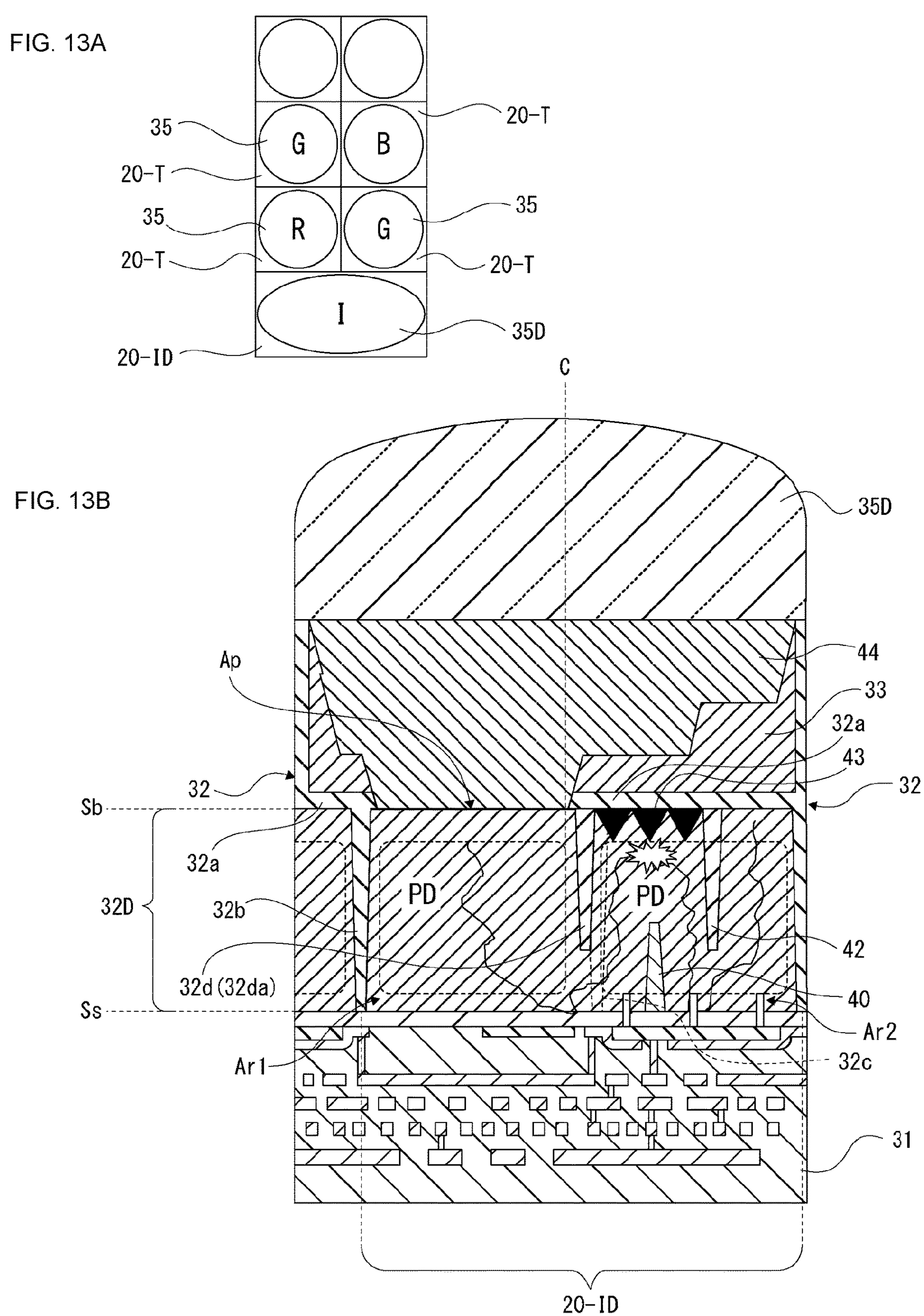
FIGS. 13A and 13B are explanatory diagrams of a second pixel as a fourth embodiment.

FIGS. 13A and 13B are explanatory diagrams of an event pixel 20-ID as the fourth embodiment.

As illustrated in FIG. 13A, in this example, the size of the event pixel 20-ID is the size of two pixels of the gradation pixel 20-T. In this case, for example, as illustrated in the drawing, the event pixel 20-ID is arranged at a position adjacent to two gradation pixels 20-T adjacent in the row direction or the column direction.

As illustrated in the drawing, a microlens 35D, which is the microlens 35 of the event pixel 20-ID, is formed to have a size over a region of two pixels of the gradation pixel 20-T, and is configured to be capable of condensing light incident on the region of two pixels.

In the event pixel 20-ID, the formation pattern of the light shielding film 32 is different from that of the gradation pixel 20-T.

Specifically, as illustrated in FIG. 13B, the light shielding film 32 of the event pixel 20-ID is formed such that the second wall portion 32*c* and the first portion 32*da* of the third wall portion 32*d* are positioned in the vicinity of a boundary line C between the two gradation pixels 20-T adjacent to the event pixel 20-ID. By positioning the second wall portion 32*c* and the first portion 32*da* in the vicinity of the boundary line C in this manner, the area of the optical opening Ap can be enlarged as compared with the case of FIGS. 6 and 8.

Here, in the event pixel 20-ID, the inside of the substrate is divided into two regions by forming the second wall portion 32*c* and the first portion 32*da*. Of these two regions, a region facing the optical opening Ap is referred to as a "first region Ar1," and the other region, that is, a region surrounded by the plane-direction film portion 32*a*, the first wall portion 32*b*, the second wall portion 32*c*, and the first portion 32*da* in the light shielding film 32 is referred to as a "second region Ar2."

In the fourth embodiment, a semiconductor substrate 30D is different from the semiconductor substrate 30 in that photodiodes PD are formed in the respective regions to be the first region Ar1 and the second region Ar2 for the regions for two pixels to be assigned as event pixels 20-ID.

Here, in the example of FIG. 13A, in the second region Ar2 of the event pixel 20-ID, a partition wall portion 40 by a non-penetrating FTI is formed similarly to that in the second embodiment, and a partition wall portion 42 by a non-penetrating trench different from the partition wall portion 40 is formed. In this example, the partition wall portion 42 is formed as a non-penetrating RTI disposed at a position farther from the first region Ar1 than the partition wall portion 40. Furthermore, similarly to the partition wall portion 40, the partition wall portion 42 is formed to cross the entire second region Ar2 in a direction orthogonal to the longitudinal cross section of FIG. 13A.

By forming a plurality of trenches as the partition wall portion 40 and the partition wall portion 41 as described above, the number of light reflecting surfaces in the second region Ar2 can be increased, and the light receiving sensitivity can be improved.

Further, in this example, the partition wall portion 40 and the partition wall portion 42 are formed as a non-penetrating FTI and a non-penetrating RTI, respectively, so that they protrude in different directions in the substrate thickness direction. Accordingly, in the second region Ar2, the conductive wire of light from the first region Ar1 to the inner part of the second region Ar2 can be formed in a zigzag shape. For this reason, the optical path length in the second region Ar2 can be extended, the photoelectric conversion portion in the second region Ar2 can be efficiently used by more easily confining the light in the inner part of the second region Ar2, and the light receiving sensitivity of the pixel for event detection can be improved.

Further, in the example of FIG. 13A, a refractive index grating 43 is formed in the second region Ar2. Accordingly, the light incident on the second region Ar2 is scattered by the refractive index grating 43, the optical path length in the second region Ar2 is extended, and the light receiving sensitivity can be improved.

Note that, in the drawing, an example is illustrated in which the refractive index grating 43 is formed in a region between the partition wall portion 41 and the wall portion by the second wall portion 32*c* and the first portion 32*da*, but the refractive index grating 43 can be formed at an arbitrary position in the second region Ar2.

Although the refractive index grating 36 illustrated in FIGS. 6 and 8 is not illustrated in FIG. 13A, in the event pixel 20-ID as well, a configuration in which the refractive index grating 36 is provided in a region overlapping the optical opening Ap as in FIGS. 6 and 8 may be employed.

Furthermore, in the event pixel 20-ID, an optical waveguide 44 is formed between the microlens 35D and the semiconductor substrate 30D in the substrate thickness direction, specifically, in the formation layer of the optical waveguide structure portion 33, for efficiently guiding incident light from the microlens 35D having a size corresponding to two pixels to the optical opening Ap having a size corresponding to approximately one pixel.

In this example, the optical waveguide 44 has a substantially conical shape in which a cross-sectional area decreases stepwise from an incident surface (incident surface of light from the microlens 35D) to an emission surface (emission surface of light to the optical opening Ap). The optical waveguide 44 includes a material having a higher refractive index than the surrounding material (that is, the protective film material of the optical waveguide 44) in the formation layer of the optical waveguide structure portion 33.

By providing the optical waveguide 44 as described above, in the event pixel 20-ID having a size equivalent to a size of a plurality of pixels of the gradation pixel 20-T, the light incident on the region corresponding to the plurality of pixels can be efficiently guided to the photoelectric conversion portion (the photodiode PD formed in the first region Ar1 in the example of FIG. 13A), and the light receiving sensitivity of the pixel for event detection can be improved.

5. Imaging Device

FIG. 14 is a block diagram illustrating a configuration example of an imaging device 10 to which the solid-state imaging element 1 as an embodiment is applied.

As illustrated in the drawing, the imaging device 10 includes the solid-state imaging element 1, and also includes an imaging optical system 11, an image signal processing unit 12, a control unit 13, a recording/reproducing control unit 14, a communication unit 15, and a bus 16, and is configured to be able to capture an image of a subject and record image data as a moving image or a still image on a recording medium.

The solid-state imaging element 1, the image signal processing unit 12, the control unit 13, the recording/reproducing control unit 14, and the communication unit 15 can mutually perform data communication via the bus 16.

The imaging optical system 11 includes, for example, a lens such as a cover lens and a focus lens, a shutter, an aperture mechanism, and the like, and is configured to guide light from a subject to a light receiving surface of the solid-state imaging element 1.

The solid-state imaging element 1 generates a gradation signal and detects an event on the basis of light received via the imaging optical system 11.

A captured image based on the gradation signal generated by the solid-state imaging element 1 is input to the image signal processing unit 12. The image signal processing unit 12 is configured as an image processing processor by, for example, a digital signal processor (DSP) or the like, and performs various types of signal processing on the captured image input from the solid-state imaging element 1. For example, preprocessing, synchronization processing, YC generation processing, resolution conversion processing, codec processing, and the like are performed. In the preprocessing, clamp processing of clamping the black levels of R, G, and B to a predetermined level, correction processing between the color channels of R, G, and B, and the like are performed on the captured image. In the synchronization processing, color separation processing is performed such that the image data for each pixel has all the R, G, and B color components. For example, in a case where the color filter 34 in the Bayer array is used, demosaic processing is performed as the color separation processing. In the YC generation processing, a luminance (Y) signal and a color (C) signal are generated (separated) from the R, G, and B images. In the resolution conversion processing, the resolution conversion processing is performed on the captured image subjected to various types of signal processing.

In the codec processing, for example, encoding processing for recording or communication and file generation are performed on the captured image subjected to the various types of processing described above. In the codec processing of this example, it is possible to generate a file in a format such as moving picture experts group (MPEG)-2 or H.264 as a moving image file format. It is also conceivable to generate a file in a format such as joint photographic experts group (JPEG), tagged image file format (TIFF), or graphics interchange format (GIF) as a still image file.

The recording/reproducing control unit 14 performs recording/reproducing on a recording medium such as a non-volatile memory, for example. The recording/reproducing control unit 14 performs, for example, processing of recording image files such as moving image data and still image data, thumbnail images, and the like on a recording medium.

Various actual forms of the recording/reproducing control unit 14 can be considered. For example, the recording/reproducing control unit 14 may be configured as a flash memory built in the imaging device 10 and a write/read circuit thereof, or may be in a form of a card recording/reproducing unit that performs recording/reproducing access to a recording medium that can be attached to and detached from the imaging device 10, for example, a memory card (portable flash memory or the like). Furthermore, as a form incorporated in the imaging device 10, the imaging device may be realized as a hard disk drive (HDD) or the like.

The communication unit 15 performs data communication and network communication with an external device in a wired or wireless manner. For example, it is possible to transmit and output captured image data (a still image file or a moving image file) to an external display device, recording device, reproduction device, or the like.

Furthermore, the communication unit 15 performs communication via a predetermined network such as the Internet or a local area network (LAN), for example, and can transmit and receive various types of data to and from a server, a terminal device, or the like on the network.

The control unit 13 includes, for example, a microcomputer (arithmetic processing device) including a central processing unit (CPU), a read only memory (ROM), and a random access memory (RAM).

The ROM of the control unit 13 stores an operating system (OS) for the CPU to control each unit, an application program for various operations, firmware, and the like. The RAM of the control unit 13 is used for temporary storage of data, programs, and the like as a work area at the time of various types of data processing of the CPU.

The control unit 13 performs overall control of the imaging device 10 by the CPU executing a program stored in the ROM or the like.

For example, the control unit 13 controls the shutter speed of the solid-state imaging element 1 and instructs the image signal processing unit 12 to perform various types of signal processing. Furthermore, the control unit 13 controls the operation of each necessary unit with respect to an imaging operation or a recording operation according to a user's operation, a reproduction operation of a recorded image file, a user interface operation, and the like. Moreover, the control unit 13 also performs control regarding focus, aperture adjustment, and the like in the imaging optical system 11.

6. Simulation Results

For the pixel structure of the embodiment, a simulation regarding light receiving sensitivity was performed. The results are as follows.

First, in a case where the volume of the photodiode PD in the event pixel 20-I was the same as that of the gradation pixel 20-T, the light receiving sensitivity to the light having a wavelength λ=940 nm was 4.0%, and the light receiving sensitivity to the light having a wavelength of λ=850 nm was 16.7%.

On the other hand, in a case where the photodiode PD was formed also in the second intra-pixel region as illustrated in FIG. 6 and the refractive index grating 36 was formed in the optical opening Ap, the light receiving sensitivity to light of λ=940 nm was 18.7%, and the light receiving sensitivity to light of λ=850 nm was 31.8%.

Moreover, in a case where the partition wall portion 40 by the non-penetrating FTI was provided in the second intra-pixel region as illustrated in FIG. 8 (with the refractive index grating 36), the light receiving sensitivity to light of λ=940 nm was 20.9%, and the light receiving sensitivity to light of λ=850 nm was 32.7%.

From this result, it can be confirmed that the light receiving sensitivity of the pixel for event detection is improved by applying the configuration as the embodiment.

7. Modification

Although the solid-state imaging element 1 and the imaging device 10 as the embodiments have been described above, the embodiments are not limited to the specific examples exemplified above, and configurations as various modifications can be employed.

For example, an example in which the depth of the first portion 32_da_ in the event pixel 20-I (the same applies to the event pixels 20-IA to 20-ID) is shallower than the depth of the first portion 32_da_ in the gradation pixel 20-T has been described above. However, the depth of the second wall portion 32_c_ in the event pixel 20-I may be shallower than the depth of the second wall portion 32_c_ or the first portion 32_da_ in the gradation pixel 20-T.

Figure 2:
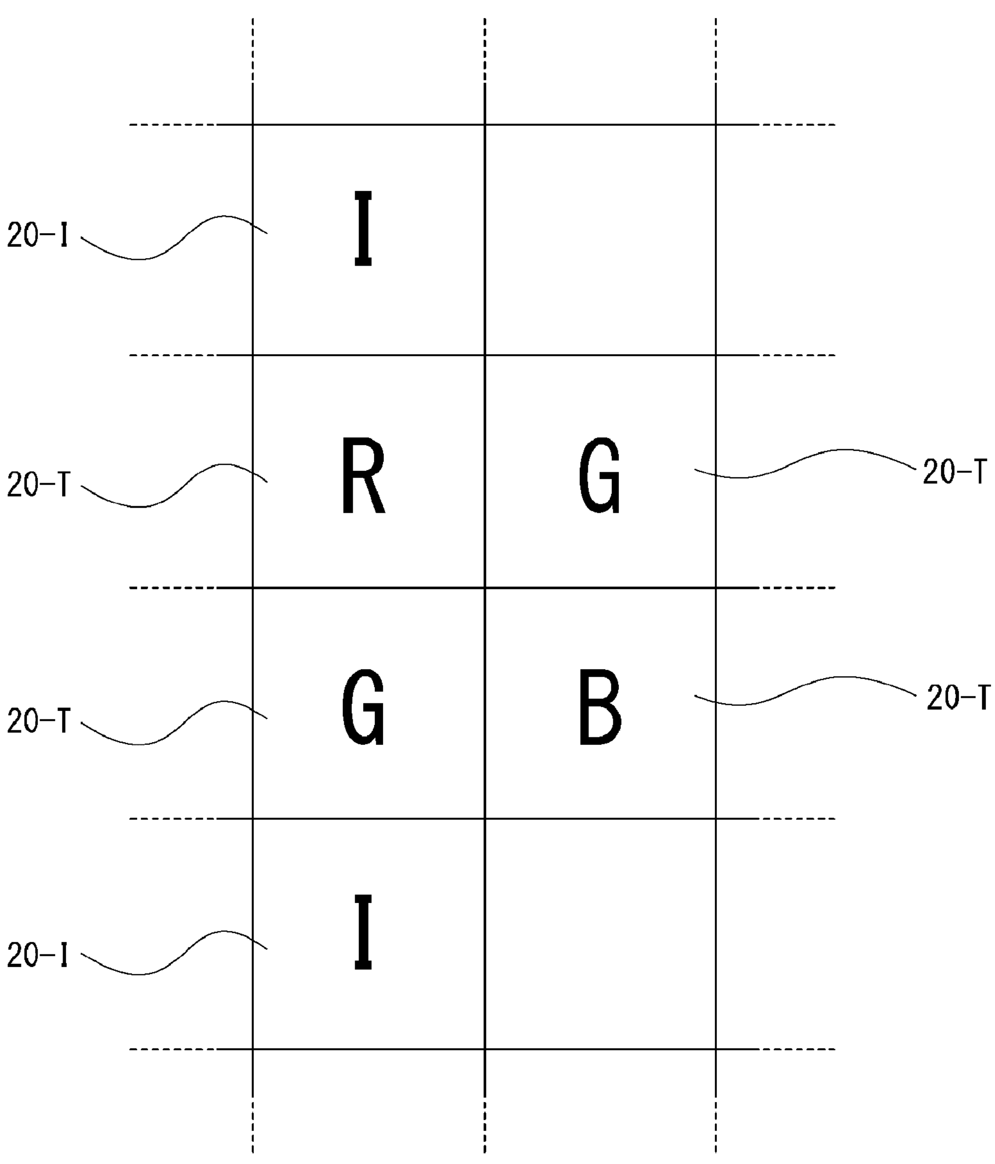
FIG. 2 is a diagram illustrating an arrangement example of a first pixel and a second pixel in a pixel array unit.

Furthermore, the arrangement pattern of the gradation pixel 20-T and the event pixel 20-I is not limited to those illustrated in FIGS. 2, 13A, and 13B, and other patterns may be employed.

8. Summary of Embodiments

As described above, a first solid-state imaging element (1 in the same) according to an embodiment includes a pixel array unit (2, 2A in the same) in which a plurality of pixels each having a photoelectric conversion portion (photodiode PD) is arranged, the pixel array unit includes, as the pixels, a first pixel (gradation pixel 20-T) for obtaining a gradation signal indicating an intensity of received light, and a second pixel (event pixel 20-I, 20-IA, 20-IB, 20-IC, 20-ID) for detecting that a change in an amount of received light exceeds a predetermined threshold value, and a volume of a photoelectric conversion portion included in the second pixel is larger than a volume of a photoelectric conversion portion included in the first pixel.

As described above, since the second pixel for detecting an event in which the change in the amount of received light exceeds the predetermined threshold value has a larger volume of the photoelectric conversion portion than the first pixel for detecting gradation, the second pixel can receive incident light in a wider range.

Therefore, the light receiving sensitivity of the pixel for event detection can be improved.

Furthermore, in the first solid-state imaging element according to the embodiment, the first pixel includes a charge accumulation portion (memory element Mc) different from a floating diffusion region (floating diffusion FD) in a semiconductor substrate (30, 30D).

Accordingly, in the first pixel, accumulated charge in the photoelectric conversion portion can be held in the charge accumulation portion other than a floating diffusion region.

Therefore, it is possible to support the global shutter system.

Moreover, in the first solid-state imaging element according to the embodiment, in an intra-pixel region of the second pixel (event pixel 20-I, 20-IA, 20-IB, 20-IC), both a first intra-pixel region that is the same intra-pixel region as a region where the photoelectric conversion portion is formed in the first pixel and a second intra-pixel region that is the same intra-pixel region as a region where the charge accumulation portion is formed in the first pixel is formed as the photoelectric conversion portion.

As described above, by forming the region where the charge accumulation portion is formed in the first pixel as the photoelectric conversion portion in the intra-pixel region of the second pixel, the volume of the photoelectric conversion portion of the second pixel becomes larger than that of the first pixel. Furthermore, by employing a configuration in which the intra-pixel region that is used as the charge accumulation portion in the first pixel is used as the photoelectric conversion portion in this manner, the frame structure that separates the photoelectric conversion portion and the charge accumulation portion from each other in the first pixel can also be applied to the second pixel side.

Therefore, the manufacturing process can be made efficient in improving the light receiving sensitivity of the pixel for event detection, and the manufacturing cost of the solid-state imaging element can be reduced.

Moreover, in the first solid-state imaging element according to the embodiment, a first trench (second wall portion 32_c_, first portion 32_da_ of third wall portion 32_d_) that is a trench separating a formation region of the photoelectric conversion portion and a formation region of the charge accumulation portion from each other is formed in the first pixel, a second trench (second wall portion 32_c_, first portion 32_da_ of third wall portion 32_d_) that is a trench separating the first intra-pixel region and the second intra-pixel region from each other is formed in the second pixel, and a depth of the second trench is shallower than a depth of the first trench.

By making the depth of the second trench, that is, the trench separating the photoelectric conversion portion formed in the second pixel shallow, light easily enters the photoelectric conversion portion on the second intra-pixel region side from the photoelectric conversion portion on the first intra-pixel region side.

Therefore, the amount of light incident on the second intra-pixel region can be increased, and the light receiving sensitivity of the pixel for event detection can be improved.

Furthermore, in the first solid-state imaging element according to the embodiment, an intra-region trench (partition wall portion 40, 41) that is a trench separating a part of the second intra-pixel region is formed in the second pixel.

By forming the intra-region trench, it is possible to increase the number of light reflecting surfaces in the second intra-pixel region. At the same time, it becomes easy to confine light in the inner part of the photoelectric conversion portion in the second intra-pixel region (it becomes difficult for light to return from the second intra-pixel region to the first intra-pixel region side).

Therefore, the optical path length of the light traveling in the photoelectric conversion portion in the second pixel can be extended, the photoelectric conversion portion in the second intra-pixel region can be efficiently used, and the light receiving sensitivity of the pixel for event detection can be improved.

Moreover, in the first solid-state imaging element according to the embodiment, the intra-region trench has four or more surfaces (see the third embodiment).

Accordingly, it is possible to further increase the number of light reflecting surfaces in the second intra-pixel region.

Therefore, the optical path length of the light traveling in the photoelectric conversion portion in the second pixel can be further extended, and the light receiving sensitivity of the pixel for event detection can be further improved.

Moreover, in the first solid-state imaging element according to the embodiment, at least a part of a cross-sectional shape of the intra-region trench has a cross shape or a T shape (see FIG. 12).

By forming at least a part of the cross-sectional shape into a cross shape or a T shape as described above, an intra-region trench having four or more surfaces is realized. At this time, forming at least a part of the cross-sectional shape of the trench into a cross shape or a T shape can be easily realized by patterning the trench at the time of forming the trench.

Therefore, a configuration for improving the light receiving sensitivity by increasing the number of reflecting surfaces in the second intra-pixel region can be realized while improving the efficiency of the manufacturing process.

Furthermore, in the first solid-state imaging element according to the embodiment, a plurality of intra-region trenches is formed (see FIGS. 11 and 12).

Accordingly, it is possible to further increase the number of light reflecting surfaces in the second intra-pixel region, and it becomes easier to confine light in the inner part of the second intra-pixel region.

Therefore, the optical path length of the light traveling in the photoelectric conversion portion in the second pixel can be extended, the photoelectric conversion portion in the second intra-pixel region can be efficiently used, and the light receiving sensitivity of the pixel for event detection can be improved.

Moreover, in the first solid-state imaging element according to the embodiment, in the second pixel, a light incident surface of the semiconductor substrate has a moth-eye structure (refractive index grating 36) (see FIGS. 6 and 8).

With the moth-eye structure described above, light via the microlens can be scattered and made incident on the photoelectric conversion portion of the second pixel.

Therefore, the optical path length of the light traveling in the photoelectric conversion portion in the second pixel can be extended, and the light receiving sensitivity of the pixel for event detection can be improved.

Moreover, in the first solid-state imaging element according to the embodiment, a size of the second pixel (event pixel 20-ID) is equivalent to a size of a plurality of pixels of the first pixel (see the fourth embodiment).

Accordingly, the photoelectric conversion portion of the second pixel can be made larger as compared with a case where the sizes of the first and second pixels are the same.

Therefore, the light receiving sensitivity of the pixel for event detection can be improved.

Furthermore, in the first solid-state imaging element according to the embodiment, in the second pixel (event pixel 20-ID), a waveguide (optical waveguide 44) that guides light toward a photoelectric conversion portion is formed between a microlens and the photoelectric conversion portion.

Accordingly, in the second pixel having the size equivalent to the size of the plurality of pixels of the first pixel, the light incident on the region corresponding to the plurality of pixels can be efficiently guided to the photoelectric conversion portion.

Therefore, the light receiving sensitivity of the pixel for event detection can be improved.

An imaging device (10 in the same) according to an embodiment includes: a solid-state imaging element (1 in the same) including a pixel array unit in which a plurality of pixels each having a photoelectric conversion portion is arranged, the pixel array unit including, as the pixels, a first pixel for obtaining a gradation signal indicating an intensity of received light and a second pixel for detecting that a change in an amount of received light exceeds a predetermined threshold value, and a volume of a photoelectric conversion portion included in the second pixel being larger than a volume of a photoelectric conversion portion included in the first pixel; and a signal processing unit (image signal processing unit 12) that receives and processes a captured image based on the gradation signal obtained by the first pixel.

Also with such an imaging device, it is possible to obtain actions and effects similar to those of the solid-state imaging element as the above-described embodiment.

Furthermore, a second solid-state imaging element (1 in the same) according to an embodiment includes: a semiconductor substrate (30, 30D in the same); a first pixel (gradation pixel 20-T) including a first photoelectric conversion portion in the semiconductor substrate in a cross-sectional view, a first charge accumulation portion (memory element Mc), and a first trench (second wall portion 32*c*, first portion 32*da* of third wall portion 32*d*) between the first photoelectric conversion portion and the first charge accumulation portion; a second pixel (event pixel 20-I, 20-IA, 20-IB, 20-IC, 20-ID) including a second photoelectric conversion portion that is adjacent to the first pixel in the cross-sectional view and is in the semiconductor substrate, a third photoelectric conversion portion, and a second trench (second wall portion 32*c*, first portion 32*da* of third wall portion 32*d*) between the second photoelectric conversion portion and the third photoelectric conversion portion; and a third trench (first wall portion 32*b*) between the first charge accumulation portion and the second photoelectric conversion portion in the cross-sectional view.

With the above configuration, the second pixel for detecting an event in which the change in the amount of received light exceeds the predetermined threshold value has a larger volume of the photoelectric conversion portion than the first pixel for detecting gradation, and thus the second pixel can receive incident light in a wider range.

Therefore, the light receiving sensitivity of the pixel for event detection can be improved.

In the second solid-state imaging element according to the above-described embodiment, the third trench is provided to penetrate the semiconductor substrate.

Accordingly, the separation performance between the first and second pixels can be enhanced.

In the second solid-state imaging element according to the above-described embodiment, the second pixel is a pixel for detecting that a change in an amount of received light exceeds a predetermined threshold value.

That is, the second pixel is a pixel for detecting an event in which the change in the amount of received light exceeds a predetermined threshold value.

Therefore, the light receiving sensitivity of the pixel for event detection can be improved.

In the second solid-state imaging element according to the above-described embodiment, the first charge accumulation portion is different from a floating diffusion region (floating diffusion FD) included in the first pixel.

Accordingly, in the first pixel, accumulated charge in the photoelectric conversion portion can be held in the charge accumulation portion other than a floating diffusion region.

Therefore, it is possible to support the global shutter system.

The second solid-state imaging element according to the above-described embodiment further includes a fourth trench (partition wall portions 40, 41) provided in the third photoelectric conversion portion.

By forming the fourth trench, it is possible to increase the number of light reflecting surfaces in the third photoelectric conversion portion. At the same time, it becomes easy to confine light in the inner part of the third photoelectric conversion portion (it becomes difficult for light to return from the third photoelectric conversion portion to the second photoelectric conversion portion side).

Therefore, the optical path length of the light traveling in the photoelectric conversion portion in the second pixel can be extended, the third photoelectric conversion portion can be efficiently used, and the light receiving sensitivity of the pixel for event detection can be improved.

In the second solid-state imaging element according to the above-described embodiment, the fourth trench is formed from a surface of the semiconductor substrate opposite to a light incident surface.

That is, the fourth trench is formed as a front trench isolation (FTI).

Accordingly, in a case where the second trench in the second pixel is formed by a reverse trench isolation (RTI), light is easily confined in the third photoelectric conversion portion, and the light receiving sensitivity of the pixel for event detection can be improved.

In the second solid-state imaging element according to the above-described embodiment, the second pixel (event pixel 20-ID) further includes a fourth photoelectric conversion portion, and a fifth trench (partition wall portion 42) is provided between the third photoelectric conversion portion and the fourth photoelectric conversion portion.

By forming the fifth trench, it is possible to increase the number of light reflecting surfaces in a photoelectric conversion region including the third photoelectric conversion portion and the fourth photoelectric conversion portion. At the same time, it becomes easy to confine light in the inner part of the photoelectric conversion region (it becomes difficult for light to return from the fourth photoelectric conversion portion to the third photoelectric conversion portion side).

Therefore, the optical path length of the light traveling in the photoelectric conversion portion in the second pixel can be extended, the fourth photoelectric conversion portion can be efficiently used, and the light receiving sensitivity of the pixel for event detection can be improved.

In the second solid-state imaging element according to the above-described embodiment, a moth-eye structure (refractive index grating 36) is provided on the second photoelectric conversion portion and on a light incident surface of the semiconductor substrate.

With the moth-eye structure described above, light via the microlens can be scattered and made incident on the photoelectric conversion portion of the second pixel.

Therefore, the optical path length of the light traveling in the photoelectric conversion portion in the second pixel can be extended, and the light receiving sensitivity of the pixel for event detection can be improved.

Note that the effects described in the present specification are merely examples and are not limited, and other effects may be provided.

9. Present Technology

Note that the present technology can also employ the following configurations.

(1)

A solid-state imaging element including a pixel array unit in which a plurality of pixels each having a photoelectric conversion portion is arranged, in which the pixel array unit includes, as the pixels, a first pixel for obtaining a gradation signal indicating an intensity of received light and a second pixel for detecting that a change in an amount of received light exceeds a predetermined threshold value, and a volume of a photoelectric conversion portion included in the second pixel is larger than a volume of a photoelectric conversion portion included in the first pixel.

(2)

The solid-state imaging element according to (1) above, in which the first pixel includes a charge accumulation portion different from a floating diffusion region in a semiconductor substrate.

(3)

The solid-state imaging element according to (2) above, in which, in an intra-pixel region of the second pixel, both a first intra-pixel region that is the same intra-pixel region as a region where the photoelectric conversion portion is formed in the first pixel and a second intra-pixel region that is the same intra-pixel region as a region where the charge accumulation portion is formed in the first pixel are formed as the photoelectric conversion portion.

(4)

The solid-state imaging element according to (3) above, in which a first trench that is a trench separating a formation region of the photoelectric conversion portion and a formation region of the charge accumulation portion from each other is formed in the first pixel, a second trench that is a trench separating the first intra-pixel region and the second intra-pixel region from each other is formed in the second pixel, and a depth of the second trench is shallower than a depth of the first trench.

(5)

The solid-state imaging element according to (3) or (4) above, in which an intra-region trench that is a trench separating a part of the second intra-pixel region is formed in the second pixel.

(6)

The solid-state imaging element according to (5) above, in which the intra-region trench has four or more surfaces.

(7)

The solid-state imaging element according to (6) above, in which at least a part of a cross-sectional shape of the intra-region trench has a cross shape or a T shape.

(8)

The solid-state imaging element according to any one of (5) to (7) above, in which a plurality of the intra-region trenches is formed.

(9)

The solid-state imaging element according to any one of (1) to (8) above, in which, in the second pixel, a light incident surface of the semiconductor substrate has a moth-eye structure.

(10)

The solid-state imaging element according to any one of (1) to (9) above, in which a size of the second pixel is equivalent to a size of a plurality of pixels of the first pixel.

(11)

The solid-state imaging element according to (10) above, in which, in the second pixel, a waveguide that guides light toward a photoelectric conversion portion is formed between a microlens and the photoelectric conversion portion.

(12)

An imaging device including:

a solid-state imaging element including a pixel array unit in which a plurality of pixels each having a photoelectric conversion portion is arranged, the pixel array unit including, as the pixels, a first pixel for obtaining a gradation signal indicating an intensity of received light and a second pixel for detecting that a change in an amount of received light exceeds a predetermined threshold value, and a volume of a photoelectric conversion portion included in the second pixel being larger than a volume of a photoelectric conversion portion included in the first pixel; and a signal processing unit that receives and processes a captured image based on the gradation signal obtained by the first pixel.

(13)

A solid-state imaging element including:

a semiconductor substrate;

a first pixel including a first photoelectric conversion portion in the semiconductor substrate in a cross-sectional view, a first charge accumulation portion, and a first trench between the first photoelectric conversion portion and the first charge accumulation portion;

a second pixel including a second photoelectric conversion portion that is adjacent to the first pixel in the cross-sectional view and is in the semiconductor substrate, a third photoelectric conversion portion, and a second trench between the second photoelectric conversion portion and the third photoelectric conversion portion; and a third trench between the first charge accumulation portion and the second photoelectric conversion portion in the cross-sectional view.

(14)

The solid-state imaging element according to (13) above, in which the third trench is provided to penetrate the semiconductor substrate.

(15)

The solid-state imaging element according to (13) or (14) above, in which the second pixel is a pixel for detecting that a change in an amount of received light exceeds a predetermined threshold value.

(16)

The solid-state imaging element according to any one of (13) to (15) above, in which the first charge accumulation portion is different from a floating diffusion region included in the first pixel.

(17)

The solid-state imaging element according to any one of (13) to (16) above, further including a fourth trench provided in the third photoelectric conversion portion.

(18)

The solid-state imaging element according to (17) above, in which the fourth trench is formed from a surface of the semiconductor substrate opposite to a light incident surface.

(19)

The solid-state imaging element according to any one of (13) to (18) above, in which the second pixel further includes a fourth photoelectric conversion portion, and a fifth trench is provided between the third photoelectric conversion portion and the fourth photoelectric conversion portion.

(20)

The solid-state imaging element according to any one of (13) to (19) above, in which a moth-eye structure is provided on the second photoelectric conversion portion and on a light incident surface of the semiconductor substrate.

REFERENCE SIGNS LIST

1 Solid-state imaging element
2, 2A Pixel array unit
4 Event processing/output circuit
5 Gradation output circuit
10 Imaging device
11 Imaging optical system
12 Image signal processing unit
13 Control unit
14 Recording/reproducing control unit
15 Communication unit
16 Bus
20 Pixel
20-T Pixel (gradation pixel)
20-I, 20-IA, 20-IB, 20-IC, 20-ID Pixel (event pixel)
PD Photodiode
FD Floating diffusion
Mc (MEM) Memory element
30, 30D Semiconductor substrate
31 Wiring layer
32 Light shielding film
32*a* Plane-direction film portion
32*b* First wall portion
32*c* Second wall portion
32*d*, 32*d*D Third wall portion
32*da* First portion
32*db* Second portion
Ap Optical opening (opening)
33 Optical waveguide structure portion
34 Color filter

35, 35D Microlens
36, 43 Refractive index grating
40, 41, 42 Partition wall portion
44 Optical waveguide
Ar1 First region
Ar2 Second region

The invention claimed is:

1. A solid-state imaging element, comprising:

a pixel array unit comprising a plurality of pixels, wherein
each pixel of the plurality of pixels includes a photoelectric conversion portion,
the plurality of pixels includes a first pixel and a second pixel,
the first pixel is configured to obtain a gradation signal that indicates an intensity of received light,
the second pixel is configured to detect that a change in an amount of the received light exceeds a threshold value,
the first pixel includes a first volume of the photoelectric conversion portion,
the second pixel includes a second volume of the photoelectric conversion portion included in the second pixel, and
the second volume is larger than the first volume.

2. The solid-state imaging element according to claim 1, further comprising a semiconductor substrate, wherein the first pixel includes:

a floating diffusion region in the semiconductor substrate; and
a charge accumulation portion, different from the floating diffusion region, in the semiconductor substrate.

3. The solid-state imaging element according to claim 2, wherein the second pixel comprises a first intra-pixel region and a second intra-pixel region,
the first intra-pixel region corresponds to a region where the photoelectric conversion portion is in the first pixel,
the second intra-pixel region corresponds to a region where the charge accumulation portion is in the first pixel, and
both the first intra-pixel region and the second intra-pixel region correspond to the photoelectric conversion portion.

4. The solid-state imaging element according to claim 3, wherein the first pixel comprises a first trench,
the first trench separates a formation region of the photoelectric conversion portion in the first pixel and a formation region of the charge accumulation portion in the first pixel,
the second pixel comprises a second trench,
the second trench separates the first intra-pixel region and the second intra-pixel region, and
a depth of the second trench is shallower than a depth of the first trench.

5. The solid-state imaging element according to claim 3, wherein the second pixel comprises an intra-region trench, and
the intra-region trench separates a first part of the second intra-pixel region and a second part of the second intra-pixel region.

6. The solid-state imaging element according to claim 5, wherein the intra-region trench has at least four surfaces.

7. The solid-state imaging element according to claim 6, wherein at least a part of a cross-sectional shape of the intra-region trench has a cross shape or a T shape.

8. The solid-state imaging element according to claim 5, wherein the second pixel comprises a plurality of intra-region trenches, and
the plurality of intra-region trenches comprises the intra-region trench.

9. The solid-state imaging element according to claim 2, wherein, in the second pixel, a light incident surface of the semiconductor substrate has a moth-eye structure.

10. The solid-state imaging element according to claim 1, wherein a size of the second pixel is equivalent to a size of a plurality of specific pixels, and
each pixel of the plurality of specific pixels is the first pixel.

11. The solid-state imaging element according to claim 10, wherein the second pixel further includes a waveguide between a microlens and the photoelectric conversion portion, and
the waveguide is configured to guide light toward the photoelectric conversion portion of the second pixel.

12. An imaging device, comprising:

a solid-state imaging element including
a pixel array unit comprising a plurality of pixels, wherein
each pixel of the plurality of pixels includes a photoelectric conversion portion,
the plurality of pixels includes a first pixel and a second pixel,
the first pixel is configured to obtain a gradation signal that indicates an intensity of received light,
the second pixel is configured to detect a change in an amount of the received light exceeds a threshold value,
the first pixel includes a first volume of the photoelectric conversion portion,
the second pixel includes a second volume of the photoelectric conversion portion included in the second pixel being, and
the second volume is larger than the first volume; and
a signal processing unit configured to:
receive a captured image; and
process the captured image based on the gradation signal obtained by the first pixel.

13. A solid-state imaging element, comprising:

a semiconductor substrate;
a first pixel including:
a first photoelectric conversion portion in the semiconductor substrate in a cross-sectional view;
a first charge accumulation portion; and
a first trench between the first photoelectric conversion portion and the first charge accumulation portion;
a second pixel including:
a second photoelectric conversion portion, in the semiconductor substrate, adjacent to the first pixel in the cross-sectional view;
a third photoelectric conversion portion;
a fourth trench in the third photoelectric conversion portion; and
a second trench between the second photoelectric conversion portion and the third photoelectric conversion portion; and
a third trench between the first charge accumulation portion and the second photoelectric conversion portion in the cross-sectional view.

14. The solid-state imaging element according to claim 13, wherein the third trench penetrates the semiconductor substrate.

15. The solid-state imaging element according to claim 13, wherein the second pixel is configured to detect that a change in an amount of received light exceeds a specific threshold value.

16. The solid-state imaging element according to claim 13, wherein the first pixel includes a floating diffusion region, and the first charge accumulation portion is different from the floating diffusion region.

17. The solid-state imaging element according to claim 13, wherein the fourth trench is from a surface of the semiconductor substrate opposite to a light incident surface of the semiconductor substrate.

18. The solid-state imaging element according to claim 13, wherein the second pixel further includes:

a fourth photoelectric conversion portion; and a fifth trench between the third photoelectric conversion portion and the fourth photoelectric conversion portion.

19. The solid-state imaging element according to claim 13, further comprising a moth-eye structure on the second photoelectric conversion portion and on a light incident surface of the semiconductor substrate.

* * * * *